United States Patent
Chen et al.

(10) Patent No.: US 11,233,085 B2
(45) Date of Patent: Jan. 25, 2022

(54) MULTI-PHOTO PIXEL CELL HAVING VERTICAL GATE STRUCTURE

(71) Applicant: Facebook Technologies, LLC, Menlo Park, CA (US)

(72) Inventors: Song Chen, Redmond, WA (US); Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 68 days.

(21) Appl. No.: 16/407,072

(22) Filed: May 8, 2019

(65) Prior Publication Data
US 2019/0348460 A1 Nov. 14, 2019

Related U.S. Application Data

(60) Provisional application No. 62/669,160, filed on May 9, 2018.

(51) Int. Cl.
| | | |
|---|---|---|
| *H01L 27/146* | (2006.01) | |
| *H04N 9/04* | (2006.01) | |
| *H04N 5/33* | (2006.01) | |

(52) U.S. Cl.
CPC .... *H01L 27/14638* (2013.01); *H01L 27/1463* (2013.01); *H01L 27/14614* (2013.01);
(Continued)

(58) Field of Classification Search
CPC ......... H01L 27/14638; H01L 27/14614; H01L 27/14621; H01L 27/14627;
(Continued)

(56) References Cited

U.S. PATENT DOCUMENTS

| | | |
|---|---|---|
| 8,134,623 B2 | 3/2012 | Purcell et al. |
| 8,144,227 B2 | 3/2012 | Kobayashi |

(Continued)

FOREIGN PATENT DOCUMENTS

| | | |
|---|---|---|
| EP | 1746820 A1 | 1/2007 |
| EP | 2063630 A1 | 5/2009 |

(Continued)

OTHER PUBLICATIONS

U.S. Appl. No. 15/668,241, "Notice of Allowance", dated Sep. 24, 2020, 13 pages.

(Continued)

*Primary Examiner* — Jennifer D Bennett
(74) *Attorney, Agent, or Firm* — Kilpatrick Townsend & Stockton LLP

(57) ABSTRACT

An apparatus is provided. The apparatus includes a semiconductor substrate including a first photodiode to generate a first charge, a second photodiode to generate a second charge, a barrier layer between the first photodiode and the second photodiode, wherein the first photodiode, the barrier layer, and the second photodiode form a stack. The apparatus further includes a floating drain and one or more gates including: a first gate portion on the semiconductor substrate and a second gate portion extending from the front side surface through the first photodiode and reaching the barrier layer. The first gate portion is configured to conduct a first signal to control flow of charge from the first photodiode to the floating drain, and the second gate portion is configured to conduct a second signal to control the barrier layer to control the flow of the second charge.

24 Claims, 27 Drawing Sheets

(52) U.S. Cl.
CPC .. *H01L 27/14621* (2013.01); *H01L 27/14627* (2013.01); *H01L 27/14629* (2013.01); *H01L 27/14634* (2013.01); *H01L 27/14645* (2013.01); *H01L 27/14649* (2013.01); *H04N 5/33* (2013.01); *H04N 9/045* (2013.01)

(58) Field of Classification Search
CPC ......... H01L 27/14629; H01L 27/14634; H01L 27/14645; H01L 27/14649; H01L 27/1463; H01L 27/14616; H01L 27/14647; H04N 9/045; H04N 5/33; H04N 5/3696; H04N 9/04563
See application file for complete search history.

(56) References Cited

U.S. PATENT DOCUMENTS

| | | |
|---|---|---|
| 8,773,562 B1 | 7/2014 | Fan |
| 8,779,346 B2 | 7/2014 | Fowler et al. |
| 8,946,610 B2 | 2/2015 | Iwabuchi et al. |
| 9,094,629 B2 | 7/2015 | Ishibashi |
| 9,185,273 B2 | 11/2015 | Beck et al. |
| 9,343,497 B2 | 5/2016 | Cho |
| 9,363,454 B2 | 6/2016 | Ito et al. |
| 9,478,579 B2 | 10/2016 | Dai et al. |
| 9,531,990 B1 | 12/2016 | Wilkins et al. |
| 10,003,759 B2 | 6/2018 | Fan |
| 10,015,416 B2 | 7/2018 | Borthakur et al. |
| 10,750,097 B2 | 8/2020 | Liu |
| 11,089,241 B2 | 8/2021 | Chen et al. |
| 2003/0020100 A1 | 1/2003 | Guidash |
| 2003/0049925 A1 | 3/2003 | Layman et al. |
| 2004/0095495 A1 | 5/2004 | Inokuma et al. |
| 2004/0251483 A1 | 12/2004 | Ko et al. |
| 2005/0057389 A1 | 3/2005 | Krymski |
| 2005/0280727 A1 | 12/2005 | Sato et al. |
| 2006/0023109 A1 | 2/2006 | Mabuchi et al. |
| 2007/0076481 A1 | 4/2007 | Tennant |
| 2007/0092244 A1 | 4/2007 | Pertsel et al. |
| 2007/0102740 A1 | 5/2007 | Ellis-Monaghan et al. |
| 2007/0222881 A1 | 9/2007 | Mentzer |
| 2008/0042046 A1 | 2/2008 | Mabuchi |
| 2008/0068478 A1 | 3/2008 | Watanabe |
| 2008/0088014 A1 | 4/2008 | Adkisson et al. |
| 2009/0002528 A1 | 1/2009 | Manabe et al. |
| 2009/0066820 A1 | 3/2009 | Jiang et al. |
| 2009/0091645 A1 | 4/2009 | Trimeche et al. |
| 2009/0128640 A1 | 5/2009 | Yumiki |
| 2009/0224139 A1 | 9/2009 | Buettgen et al. |
| 2009/0244328 A1 | 10/2009 | Yamashita |
| 2009/0261235 A1 | 10/2009 | Lahav et al. |
| 2009/0303371 A1* | 12/2009 | Watanabe ......... H01L 27/14641 348/311 |
| 2010/0140732 A1 | 6/2010 | Eminoglu et al. |
| 2010/0276572 A1 | 11/2010 | Iwabuchi et al. |
| 2011/0049589 A1 | 3/2011 | Chuang et al. |
| 2011/0149116 A1 | 6/2011 | Kim |
| 2011/0254986 A1 | 10/2011 | Nishimura et al. |
| 2011/0298074 A1 | 12/2011 | Funao |
| 2012/0039548 A1 | 2/2012 | Wang et al. |
| 2012/0075511 A1 | 3/2012 | Tay |
| 2012/0092677 A1 | 4/2012 | Suehira et al. |
| 2012/0127284 A1 | 5/2012 | Bar-Zeev et al. |
| 2012/0133807 A1 | 5/2012 | Wu et al. |
| 2012/0188420 A1 | 7/2012 | Black et al. |
| 2012/0241591 A1 | 9/2012 | Wan et al. |
| 2012/0262616 A1 | 10/2012 | Sa et al. |
| 2012/0273654 A1 | 11/2012 | Hynecek et al. |
| 2012/0273906 A1 | 11/2012 | Mackey et al. |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0082313 A1 | 4/2013 | Manabe |
| 2013/0113969 A1 | 5/2013 | Manabe et al. |
| 2013/0120615 A1 | 5/2013 | Hirooka et al. |
| 2013/0120625 A1 | 5/2013 | Ishii et al. |
| 2013/0126710 A1 | 5/2013 | Kondo |
| 2013/0141619 A1 | 6/2013 | Lim et al. |
| 2013/0207219 A1 | 8/2013 | Ahn |
| 2013/0234029 A1 | 9/2013 | Bikumandla |
| 2013/0248685 A1 | 9/2013 | Ahn |
| 2013/0293752 A1 | 11/2013 | Peng et al. |
| 2013/0299674 A1 | 11/2013 | Fowler et al. |
| 2013/0300906 A1 | 11/2013 | Yan |
| 2014/0021574 A1 | 1/2014 | Egawa |
| 2014/0042299 A1 | 2/2014 | Wan et al. |
| 2014/0042582 A1 | 2/2014 | Kondo |
| 2014/0085523 A1 | 3/2014 | Hynecek |
| 2014/0176770 A1 | 6/2014 | Kondo |
| 2014/0211052 A1 | 7/2014 | Choi |
| 2014/0306276 A1 | 10/2014 | Yamaguchi |
| 2015/0048427 A1 | 2/2015 | Hu et al. |
| 2015/0083895 A1 | 3/2015 | Hashimoto et al. |
| 2015/0090863 A1 | 4/2015 | Mansoorian et al. |
| 2015/0172574 A1 | 6/2015 | Honda et al. |
| 2015/0189209 A1 | 7/2015 | Yang et al. |
| 2015/0279884 A1 | 10/2015 | Kusumoto |
| 2015/0287766 A1 | 10/2015 | Kim et al. |
| 2015/0312502 A1 | 10/2015 | Borremans |
| 2015/0350582 A1 | 12/2015 | Korobov et al. |
| 2015/0358569 A1 | 12/2015 | Egawa |
| 2015/0358593 A1 | 12/2015 | Sato |
| 2015/0381907 A1 | 12/2015 | Boettiger et al. |
| 2016/0028974 A1 | 1/2016 | Guidash et al. |
| 2016/0035770 A1 | 2/2016 | Ahn et al. |
| 2016/0037111 A1 | 2/2016 | Dai et al. |
| 2016/0088253 A1 | 3/2016 | Tezuka |
| 2016/0093659 A1* | 3/2016 | Nakamura .......... H01L 27/1461 250/208.1 |
| 2016/0100115 A1 | 4/2016 | Kusano |
| 2016/0111457 A1* | 4/2016 | Sekine .............. H01L 27/14612 257/228 |
| 2016/0165160 A1 | 6/2016 | Hseih et al. |
| 2016/0204150 A1 | 7/2016 | Oh et al. |
| 2016/0225813 A1 | 8/2016 | Liao et al. |
| 2016/0240570 A1 | 8/2016 | Barna et al. |
| 2016/0276394 A1 | 9/2016 | Chou et al. |
| 2016/0307945 A1 | 10/2016 | Madurawe |
| 2016/0337605 A1* | 11/2016 | Ito .................... H01L 27/14612 |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0053962 A1 | 2/2017 | Oh et al. |
| 2017/0062501 A1 | 3/2017 | Velichko et al. |
| 2017/0099422 A1 | 4/2017 | Goma et al. |
| 2017/0104021 A1 | 4/2017 | Park et al. |
| 2017/0104946 A1 | 4/2017 | Hong |
| 2017/0170223 A1 | 6/2017 | Hynecek et al. |
| 2017/0207268 A1 | 7/2017 | Kurokawa |
| 2017/0366766 A1 | 12/2017 | Geurts et al. |
| 2018/0019269 A1 | 1/2018 | Klipstein |
| 2018/0213205 A1 | 7/2018 | Oh |
| 2018/0286896 A1 | 10/2018 | Kim et al. |
| 2019/0052788 A1 | 2/2019 | Liu |
| 2019/0056264 A1 | 2/2019 | Liu |
| 2019/0057995 A1 | 2/2019 | Liu |
| 2019/0058058 A1 | 2/2019 | Liu |
| 2019/0124285 A1 | 4/2019 | Otaka |
| 2019/0172868 A1 | 6/2019 | Chen et al. |
| 2019/0348460 A1 | 11/2019 | Chen et al. |
| 2019/0371845 A1 | 12/2019 | Chen et al. |

FOREIGN PATENT DOCUMENTS

| | | |
|---|---|---|
| KR | 20110050351 A | 5/2011 |
| WO | 2017069706 A1 | 4/2017 |
| WO | 2019168929 A1 | 9/2019 |

OTHER PUBLICATIONS

U.S. Appl. No. 16/435,449, "Notice of Allowance", dated Sep. 16, 2020, 7 pages.

(56) References Cited

OTHER PUBLICATIONS

U.S. Appl. No. 16/210,748, "Advisory Action", dated Oct. 8, 2020, 4 pages.
U.S. Appl. No. 16/384,720, "Notice of Allowance", dated Oct. 14, 2020, 8 pages.
U.S. Appl. No. 16/436,049, "Notice of Allowance", dated Oct. 21, 2020, 8 pages.
U.S. Appl. No. 16/544,136, "Notice of Allowance", dated Oct. 15, 2020, 11 pages.
U.S. Appl. No. 15/847,517, "Non-Final Office Action", dated Nov. 23, 2018, 21 pages.
Cho, et al., "A Low Power Dual CDS for a Column-Parallel CMOS Image Sensor", Journal of Semiconductor Technology and Science, vol. 12, No. 4, Dec. 30, 2012, pp. 388-396.
European Application No. EP18179838.0, "Partial European Search Report", dated Dec. 5, 2018, 14 pages.
European Application No. EP18179846.3, "Extended European Search Report", dated Dec. 7, 2018, 10 pages.
European Application No. EP18179851.3, "Extended European Search Report", dated Dec. 7, 2018, 8 pages.
International Application No. PCT/US2018/039350, "International Search Report and Written Opinion", dated Nov. 15, 2018, 13 pages.
International Application No. PCT/US2018/039352, "International Search Report and Written Opinion", dated Oct. 26, 2018, 10 pages.
International Application No. PCT/US2018/039431, "International Search Report and Written Opinion", dated Nov. 7, 2018, 14 pages.
International Application No. PCT/US2018/064181, "International Search Report and Written Opinion", dated Mar. 29, 2019, 12 pages.
International Application No. PCT/US2019/031521, International Search Report and Written Opinion dated Jul. 11, 2019, 11 pages.
U.S. Appl. No. 15/668,241, "Advisory Action", dated Oct. 23, 2019, 5 pages.
U.S. Appl. No. 15/668,241, "Final Office Action", dated Jun. 17, 2019, 19 pages.
U.S. Appl. No. 15/668,241, "Non-Final Office Action", dated Dec. 21, 2018, 3 pages.
U.S. Appl. No. 15/668,241, "Notice of Allowance", dated Jun. 29, 2020, 8 pages.
U.S. Appl. No. 15/668,241, "Notice of Allowance", dated Mar. 5, 2020, 8 pages.
U.S. Appl. No. 15/668,241, "Supplemental Notice of Allowability", dated Apr. 29, 2020, 5 pages.
U.S. Appl. No. 15/801,216, "Advisory Action", dated Apr. 7, 2020, 3 pages.
U.S. Appl. No. 15/801,216, "Final Office Action", dated Dec. 26, 2019, 5 pages.
U.S. Appl. No. 15/801,216, "Non-Final Office Action", dated Jun. 27, 2019, 13 pages.
U.S. Appl. No. 15/801,216, "Notice of Allowance", dated Jun. 23, 2020, 5 pages.
U.S. Appl. No. 15/983,391, "Non-Final Office Action", dated Aug. 29, 2019, 12 pages.
U.S. Appl. No. 15/983,391, "Notice of Allowance", dated Apr. 8, 2020, 8 pages.
U.S. Appl. No. 16/210,748, "Final Office Action", dated Jul. 7, 2020, 11 pages.
U.S. Appl. No. 16/210,748, "Non-Final Office Action", dated Jan. 31, 2020, 11 pages.
U.S. Appl. No. 16/384,720, "Non-Final Office Action", dated May 1, 2020, 6 pages.
U.S. Appl. No. 16/384,720, "Notice of Allowance", dated Aug. 26, 2020, 8 pages.
U.S. Appl. No. 16/435,449, "Notice of Allowance", dated Jul. 27, 2020, 8 pages.
U.S. Appl. No. 16/436,049, "Non-Final Office Action", dated Jun. 30, 2020, 11 pages.
U.S. Appl. No. 16/436,049, "Non-Final Office Action", dated Mar. 4, 2020, 9 pages.
EP18188684.7, "Extended European Search Report", dated Jan. 16, 2019, 10 pages.
EP18188684.7, "Office Action", dated Nov. 26, 2019, 9 pages.
EP18188962.7, "Extended European Search Report", dated Oct. 23, 2018, 8 pages.
EP18188962.7, "Office Action", dated Aug. 28, 2019, 6 pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/045673, "International Search Report and Written Opinion", dated Dec. 4, 2018, 13 pages.
PCT/US2018/064181, "International Preliminary Report on Patentability", dated Jun. 18, 2020, 9 pages.
PCT/US2019/027727, "International Search Report and Written Opinion", dated Jun. 27, 2019, 11 pages.
PCT/US2019/036492, "International Search Report and Written Opinion", dated Sep. 25, 2019, 9 pages.
PCT/US2019/036536, "International Search Report and Written Opinion", dated Sep. 26, 2019, 14 pages.
PCT/US2019/047156, "International Search Report and Written Opinion", dated Oct. 23, 2019, 9 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
U.S. Appl. No. 16/384,720, "Corrected Notice of Allowability", dated Jan. 25, 2021, 4 pages.
U.S. Appl. No. 16/544,136, "Corrected Notice of Allowability", dated Jan. 29, 2021, 2 pages.
EP18886564.6, "Extended European Search Report", dated Jan. 26, 2021, 6 pages.
U.S. Appl. No. 16/210,748, "Non-Final Office Action", dated Feb. 2, 2021, 8 pages.
U.S. Appl. No. 16/672,427, "Non Final Office Action", dated Dec. 7, 2020, 8 pages.
U.S. Appl. No. 16/560,665, "Non-Final Office Action", dated Apr. 29, 2021, 17 pages.
U.S. Appl. No. 16/210,748, "Notice of Allowance", dated Jul. 9, 2021, 6 pages.
International Application No. PCT/US2019/027727, International Preliminary Report on Patentability dated Oct. 29, 2020, 8 pages.
U.S. Appl. No. 16/436,049, "Supplemental Notice of Allowability", dated Jul. 8, 2021, 2 pages.
U.S. Appl. No. 16/672,427, "Final Office Action", dated Jul. 8, 2021, 10 pages.
U.S. Appl. No. 16/210,748, "Corrected Notice of Allowability", dated Dec. 1, 2021, 3 pages.
U.S. Appl. No. 16/210,748, "Corrected Notice of Allowability", dated Dec. 7, 2021, 3 pages.
U.S. Appl. No. 16/210,748, "Notice of Allowance", dated Oct. 27, 2021, 6 pages.
U.S. Appl. No. 16/560,665, "Final Office Action", dated Nov. 3, 2021, 19 pages.
U.S. Appl. No. 16/672,427, "Notice of Allowability", dated Nov. 10, 2021, 6 pages.
U.S. Appl. No. 16/672,427, "Notice of Allowance", dated Oct. 29, 2021, 9 pages.

* cited by examiner

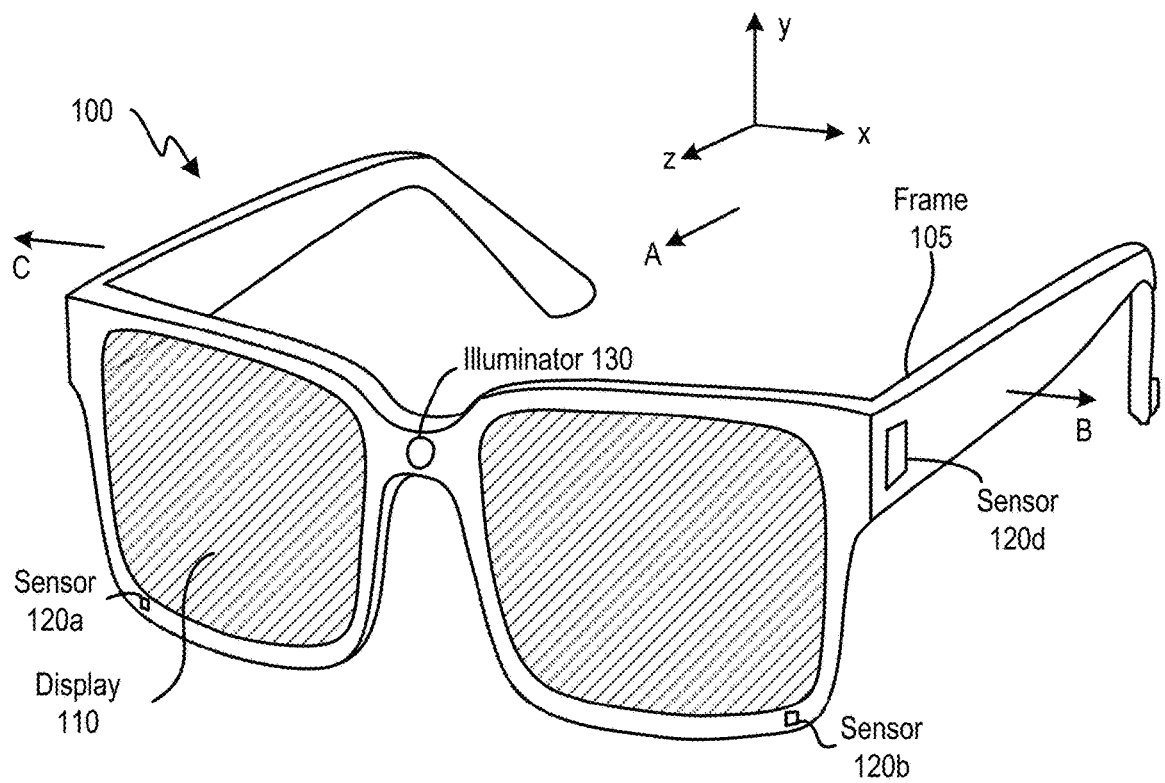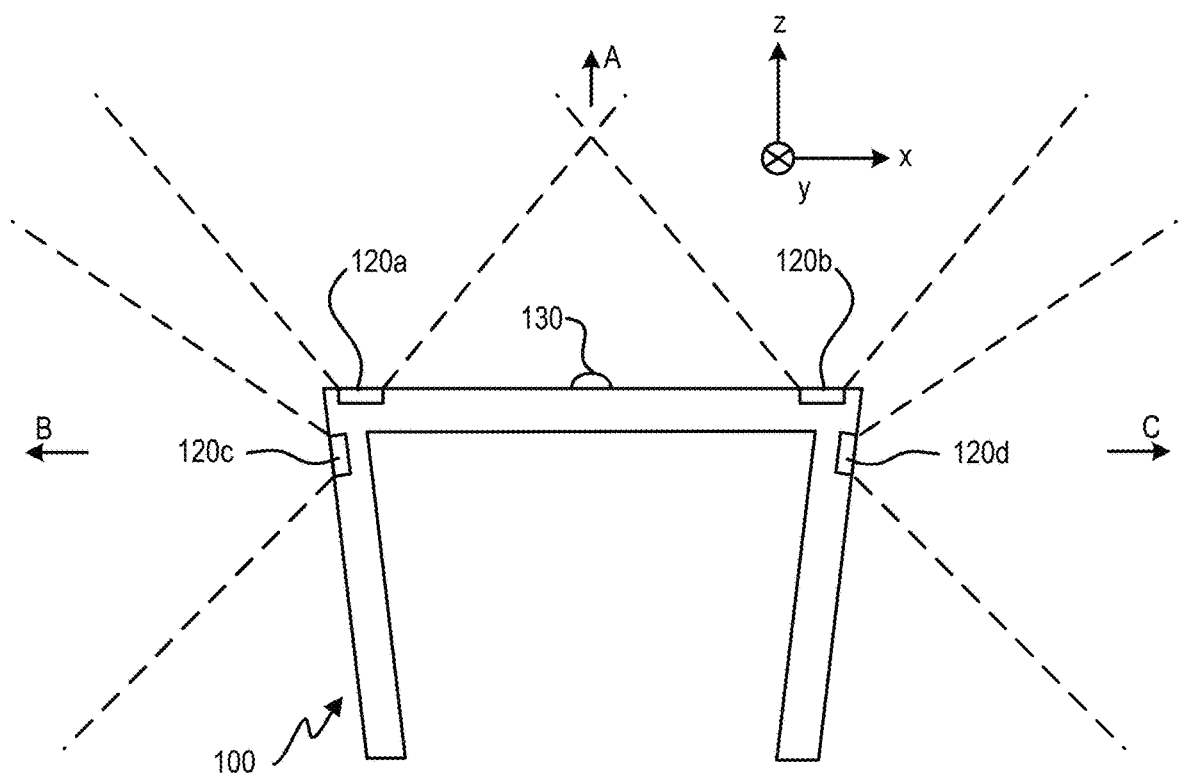
FIG. 1A

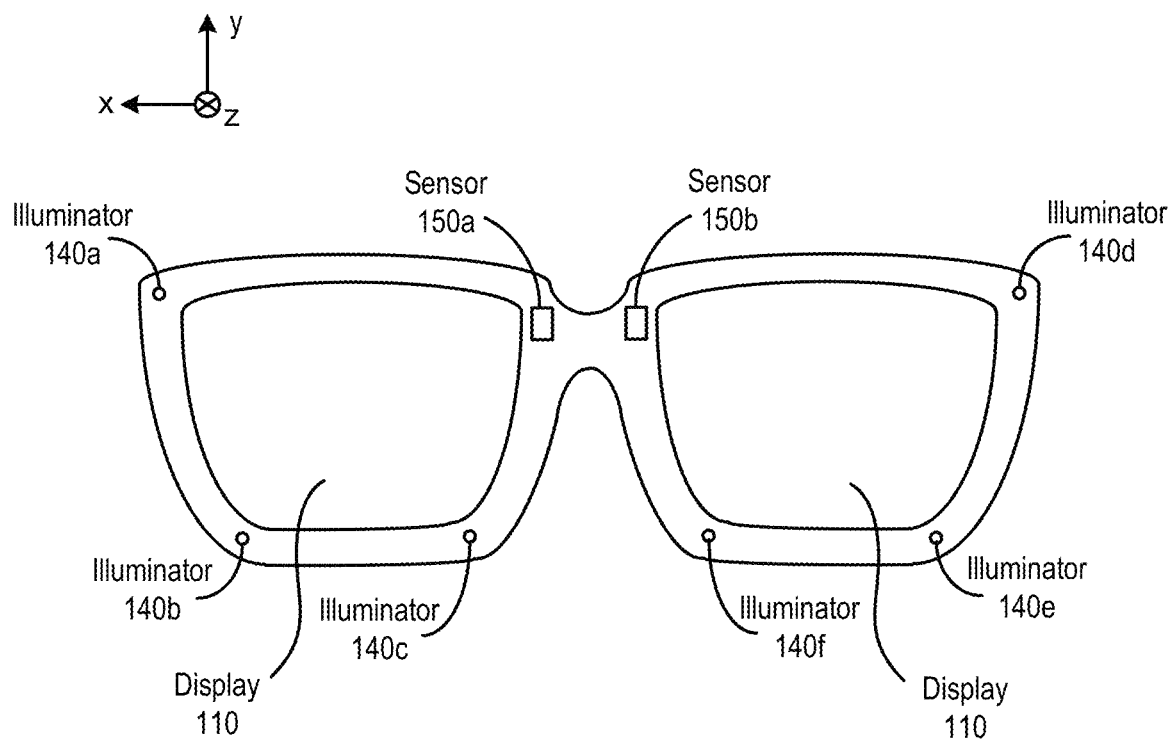
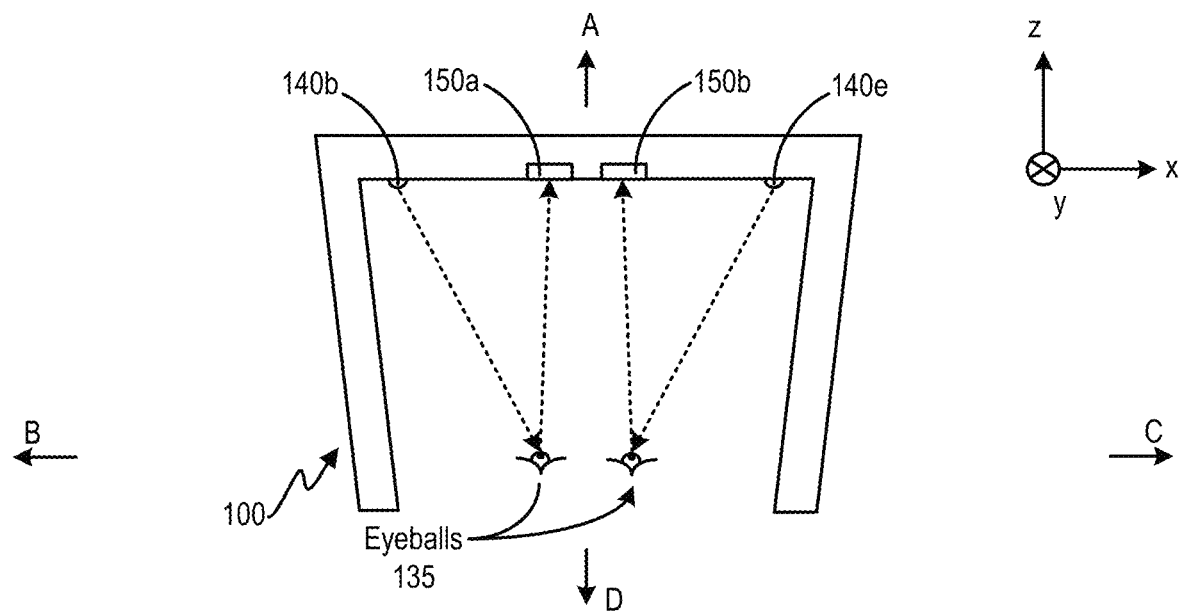
FIG. 1B

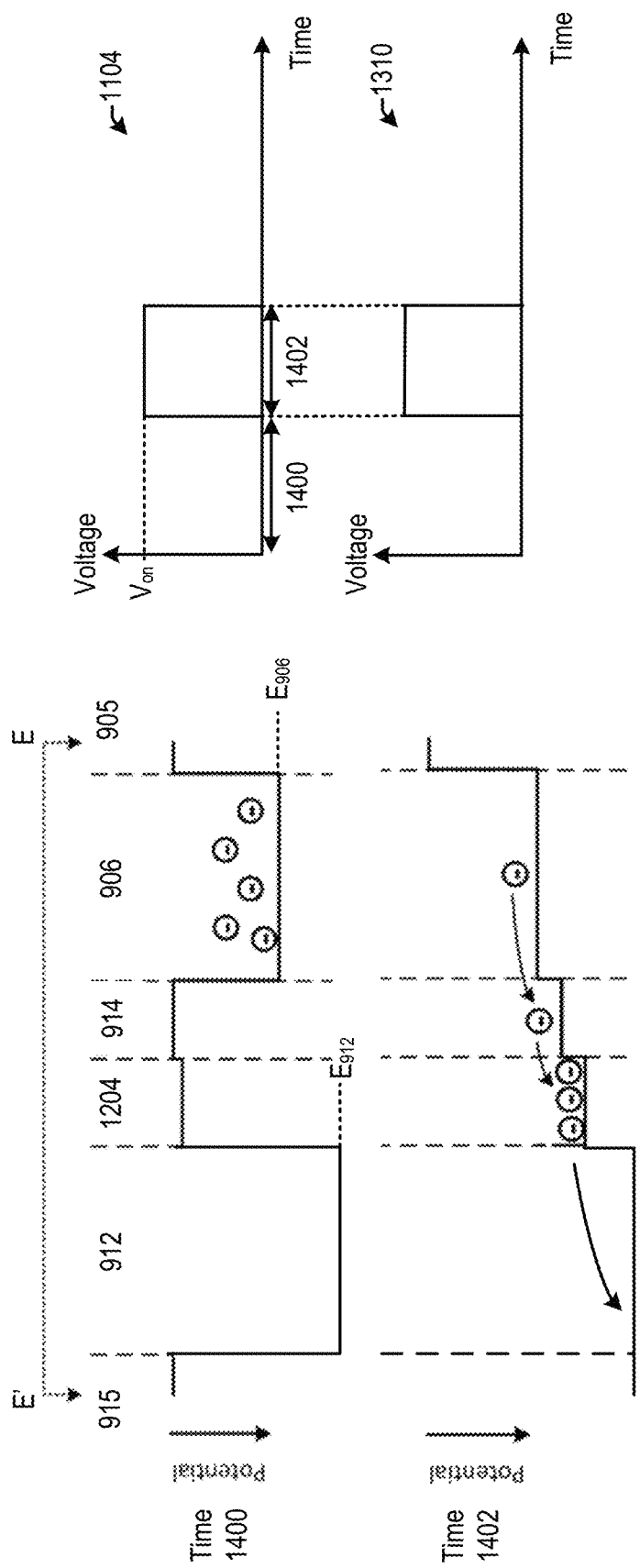

2000

2002 — Transmitting, via a first gate portion of one or more gates, a first signal to transfer first charge from a first photodiode to a floating drain via a channel region between the first photodiode and the floating drain for read out, wherein the first gate portion is formed on a front side surface of a semiconductor substrate, the semiconductor substrate further including the floating drain, the first photodiode to generate the first charge, a second photodiode to generate a second charge, a barrier layer between the first photodiode and the second photodiode, the first photodiode, the barrier layer, and the second photodiode forming a stack along an axis perpendicular to the front side surface

2004 — Quantizing the first charge in the floating drain to measure an intensity of light of a first wavelength range

2006 — Transmitting, via a second gate portion of the one or more gates, a second signal to transfer the second charge from the second photodiode to the first photodiode via the barrier layer, wherein the second gate portion extends from the front side surface through the first photodiode and reaches the barrier layer

2008 — Transmitting the first signal via the first gate portion to transfer the second charge from the first photodiode to the floating drain via the channel region

2010 — Quantizing the second charge in the floating drain to measure an intensity of light of a second wavelength range

FIG. 20

MULTI-PHOTO PIXEL CELL HAVING VERTICAL GATE STRUCTURE

RELATED APPLICATIONS

This patent application claims priority to U.S. Provisional Patent Application Ser. No. 62/669,160, filed May 9, 2018, entitled "PIXEL STRUCTURE WITH VERTICALLY-STACKED PINNED PHOTODIODES AND DEEP-GATE-BASED BARRIER SWITCHING," which is assigned to the assignee hereof and are incorporated herein by reference in their entirety for all purposes.

BACKGROUND

The disclosure relates generally to image sensors, and more specifically to pixel cell that includes multiple photodiodes.

A typical pixel in an image sensor includes a photodiode to sense incident light by converting photons into charge (e.g., electrons or holes). The charge can be temporarily stored in photodiode during an exposure period. For improved noise and dark current performances, a pinned photodiode can be included in the pixel to convert the photons into charge. The pixel may further include a capacitor (e.g., a floating diffusion) to collect the charge from the photodiode and to convert the charge to a voltage. An image of a scene can be derived from the voltages developed at the capacitors of an array of pixels.

SUMMARY

The present disclosure relates to image sensors. More specifically, and without limitation, this disclosure relates to an image sensor having an array of pixel cells.

In some examples, an apparatus is provided. The apparatus comprises a semiconductor substrate including a front side surface, a first photodiode configured to generate a first charge, a second photodiode configured to generate a second charge, a barrier layer between the first photodiode and the second photodiode and configured to control flow of the second charge from the second photodiode to the first photodiode, and a floating drain to store the first charge or the second charge. The first photodiode, the barrier layer, and the second photodiode form a stack along an axis perpendicular to the front side surface. The apparatus further comprises one or more gates including: a first gate portion on the front side surface over a channel region between the first photodiode and the floating drain; and a second gate portion extending from the front side surface through the first photodiode and reaching the barrier layer. The first gate portion is configured to conduct a first signal to control flow of charge from the first photodiode to the floating drain via the channel region. The second gate portion is configured to conduct a second signal to control the barrier layer to control the flow of the second charge.

In some aspects, the apparatus further comprises a controller configured to: transmit the first signal via the first gate portion to transfer the first charge from the first photodiode to the floating drain via the channel region for read out; transmit the second signal via the second gate portion to transfer the second charge from the second photodiode to the first photodiode via the barrier layer; and transmit the first signal via the first gate portion to transfer the second charge from the second photodiode to the floating drain via the channel region for read out.

In some aspects, the semiconductor substrate is a first semiconductor substrate. The apparatus further includes a second semiconductor substrate. The controller is part of the second semiconductor substrate.

In some aspects, the semiconductor substrate includes a back side surface opposite to the front side surface configured as a light receiving surface. The first photodiode is configured to convert a first component of light within an infra-red light wavelength range to the first charge. The second photodiode is configured to convert a second component of light within a visible light wavelength range to the second charge.

In some aspects, the front side surface is configured as a light receiving surface; the first photodiode is configured to convert a first component of light within a visible light wavelength range to the first charge; and the second photodiode is configured to convert a second component of light within an infra-red light wavelength range to the second charge.

In some aspects, the semiconductor substrate includes a P-well forming a sidewall on four sides of the stack of the first photodiode, the barrier layer, and the second photodiode. The second portion extends along a center line through the first photodiode, the center line being of equal distance from at least two of the sidewalls formed by the P-well.

In some aspects, the apparatus further comprises an oxide layer between the second gate portion and the first photodiode; and an interface passivation region (IPR) between the oxide layer and the first photodiode.

In some aspects, the IPR and the barrier layer are configured to have provide an electrical potential gradient from the second photodiode to the first photodiode.

In some aspects, the IPR and the barrier layer have different doping profiles to provide the electrical potential gradient.

In some aspects, the second gate portion is doped with dopants having a doping concentration gradient along the axis to introduce the electrical potential gradient.

In some aspects, the second photodiode is biased at a first voltage; the barrier layer is biased at a second voltage by a signal at the second gate portion; the first photodiode is biased at a third voltage; the channel region is biased at a fourth voltage by a signal at the first gate portion; and the first voltage, the second voltage, the third voltage, and the fourth voltage form an electrical potential gradient from the second photodiode to the channel region to enable the second charge to flow following the electrical potential gradient.

In some aspects, the apparatus further comprises a guard ring structure that shields an end portion of the second gate portion from the barrier layer.

In some aspects, the second gate portion has non-uniform cross-sectional areas.

In some aspects, the second gate portion has a wedge shape and includes a tilted sidewall that tilts towards a light receiving surface.

In some aspects, the semiconductor substrate further includes a deep trench isolation (DTI) structure that extend along the axis. At least a part of the first photodiode is between the DTI structure and the tilted sidewall of the second gate portion. The tilted sidewall also tilts towards the DTI structure and configured to reflect the first light component towards the DTI structure and through the at least a part of the first photodiode. The DTI structure is configured reflect the first light component towards the tilted sidewall and through the at least a part of the first photodiode.

In some aspects, the one or more gates comprise a first gate comprising the first gate portion and a second gate comprising the second gate portion. The first gate and the second gate are electrically insulated from each other.

In some aspects, the one or more gates comprise a merged gate comprising the first gate portion and the second gate portion electrically connected to each other.

In some aspects, the first signal is transmitted via the first gate portion to transfer the first charge from the first photodiode to the floating drain via the channel region for read out; the second signal is transmitted via the second gate portion to: transfer the second charge from the second photodiode to the first photodiode via the barrier layer; and transfer the second charge from the second photodiode to the floating drain via the channel region for read out. The first signal is insufficient to cause the second charge to flow from the second photodiode to the first photodiode via the barrier layer.

In some examples, a method is provided. The method comprises: transmitting, via a first gate portion of one or more gates, a first signal to transfer first charge from a first photodiode to a floating drain via a channel region between the first photodiode and the floating drain for read out, wherein the first gate portion is formed on a front side surface of a semiconductor substrate, the semiconductor substrate further including the floating drain, the first photodiode to generate the first charge, a second photodiode to generate a second charge, a barrier layer between the first photodiode and the second photodiode, the first photodiode, the barrier layer, and the second photodiode forming a stack along an axis perpendicular to the front side surface; quantizing the first charge in the floating drain to measure an intensity of light of a first wavelength range; transmitting a second signal via a second gate portion of the one or more gates to transfer the second charge from the second photodiode to the first photodiode via the barrier layer, wherein the second gate portion extends from the front side surface through the first photodiode along the axis and reaches the barrier layer; transmitting the first signal via the first gate portion to transfer the second charge from the first photodiode to the floating drain via the channel region; and quantizing the second charge in the floating drain to measure an intensity of light of a second wavelength range.

In some aspects, the first wavelength range corresponds to a wavelength range of infra-red light. The second wavelength range corresponds to a wavelength range of visible light.

BRIEF DESCRIPTION OF THE DRAWINGS

Illustrative embodiments are described with reference to the following figures:

FIG. 1A and FIG. 1B are diagrams of an embodiment of a near-eye display.

FIG. 14A and FIG. 14B illustrate examples of operations of pixel cell of FIG. 8.

FIG. 20 illustrates a flowchart of an example method of measuring light intensity.

Figure 2:
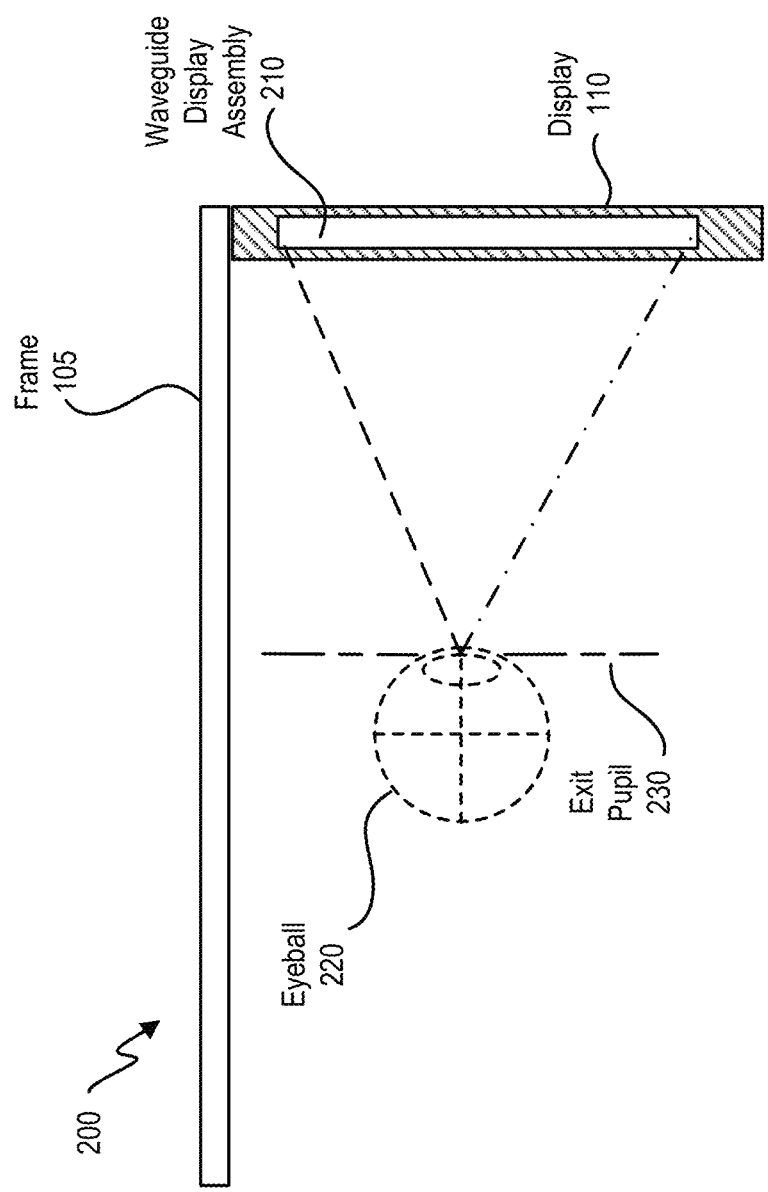
FIG. 2 is an embodiment of a cross section of the near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor typically includes an array of pixel cells. Each pixel cell may have a photodiode to sense incident light by converting photons into charge (e.g., electrons or holes). For improved noise and dark current performances, a pinned photodiode can be included in the pixel to convert the photons into charge. The charge can be temporarily stored in the photodiode during an exposure period. Each pixel cell may also include a floating diffusion node to convert the charge to a voltage. A pixel value can be generated based on the voltage. The pixel value can represent an intensity of light received by the pixel cell. An image comprising an array of pixels can be derived from the digital outputs of the voltages output by an array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, and blue colors) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, a subset (e.g., a first set) of the pixel cells within the array can be used to perform 2D sensing of the scene, and another subset (e.g., a second set) of the pixel cells within the array can be used to perform 3D sensing of the scene. The fusion of 2D and 3D imaging data are useful for many applications that provide virtual-reality (VR), augmented-reality (AR) and/or mixed reality (MR) experiences. For example, a wearable VR/AR/AR system may perform a scene reconstruction of an environment in which the user of the system is located. Based on the reconstructed scene, the VR/AR/AR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Using different sets of pixel for 2D and 3D imaging, however, can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges (for 2D and 3D imaging) are not collocated, different pixel cells may capture information of different spots of a scene, which can complicate the mapping between 2D and 3D images. For example, a pixel cell that receives a certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption.

The present disclosure relates to an image sensor having an array of pixel cells. In some embodiments, each pixel cell includes a semiconductor substrate. The semiconductor substrate includes a first photodiode, a barrier layer, and a second photodiode forming a stack along a propagation path of light within the semiconductor substrate. The first photodiode can convert a first component of the light to a first charge, whereas the second photodiode can convert a second component of the light to a second charge. In some examples, both the first photodiode and the second photodiode can be pinned photodiodes. The semiconductor substrate further includes a floating drain. The first photodiode can transfer the first charge to the floating drain for read out. The second photodiode can also transfer the second charge, via the first photodiode, to the floating drain for read out. The barrier carrier is sandwiched between the first photodiode and the second photodiode and can control the transfer of the second charge from the second photodiode to the first photodiode.

The pixel cell further includes one or more gates. The one or more gates include a first gate portion and a second gate portion. The first gate portion may be formed on a front side surface of the first semiconductor substrate and may extend over a channel region between the first photodiode and the floating diffusion node. The second gate portion may extend from the front side surface into the semiconductor substrate and intersect the first photodiode and reach the barrier layer. The first gate portion can transmit a first signal to adjust the electrical potential of the channel region to control transfer of first charge or second charge from the first photodiode to the floating diffusion node. The second gate portion can transmit a second signal to adjust the electrical potential of the barrier layer to control transfer of the second charge from the second photodiode to the first photodiode. In some embodiments, the one or more gates can include a first gate comprising the first gate portion and a second gate comprising the second gate portion, with the first gate and second gate being electrically isolated from each other. In some embodiments, to shrink the footprint of the pixel cell, the one or more gate may comprise a merged gate, with the first gate portion and the second gate portion being electrically connected to each other.

Various techniques are proposed to improve the flow of the second charge under the control of the second gate. For example, the second gate can extend along a center line of the stack of the first photodiode, the barrier layer, and the second photodiode where the majority of charge is located, as the incident light is typically concentrated at the center line of the pixel cell as it propagates within the stack. With such arrangements, the propagation path across the barrier layer for the majority of the second charge can be shortened, which can facilitate the flow of the second charge via the barrier layer. As another example, the semiconductor substrate may include an interface passivation region (IPR) surrounding the interface between the second gate and the first photodiode to reduce dark current. An electrical potential gradient can also be introduced across the barrier layer and the IPR to facilitate the flow of the second charge from the second photodiode into the first photodiode, and to prevent charge from flowing from the first photodiode back to the second photodiode. As yet another example, to account for a case where the second gate penetrates through the barrier layer and reaches the second photodiode (e.g., by design, due to limitations in the process control, etc.), the semiconductor substrate can include a guard ring to isolate the second gate from the second photodiode to prevent trapping of the second charge at where the second gate intersects/reaches the second photodiode.

The pixel cell further includes a controller and a processing circuit, which can be part of the semiconductor substrate or can be formed in a separate semiconductor substrate. The controller can transmit a first signal to the first gate to enable transfer of the first charge from the first photodiode to the floating diffusion node. The processing circuit can read out and quantize the first charge in the floating drain node to generate a first digital representation of the first component of the light. The controller can reset the floating drain node after the measurement completes. The controller can then transmit a second signal to control the barrier layer to allow the second charge to flow from the second photodiode to the first photodiode. The controller can also transmit the first signal to the first gate to enable transfer of the second charge from the first photodiode to the floating diffusion node. The processing circuit can read out and quantize the second charge in the floating drain node to generate a second digital representation of the second component of the light. In a case where the second gate and the first gate are electrically shorted together forming a merged gate, the merged gate can transmit the first signal and the second signal at different times. The first signal and the second signal can also have different signal levels, to ensure that the transfer of charge (first charge or second charge) from the first photodiode to the floating drain and the transfer of second charge via the barrier layer also occur at different times responsive to the first signal and the second signal.

With examples of the present disclosure, a pixel cell can use pinned photodiodes to perform photon-to-charge conversion for 2D and 3D imaging operations. As pinned photodiodes can provide superior performance in terms of dark current and noise, the pixel cell can measure light of low intensity more accurately, which can improve the image sensor's sensitivity and performance in an environment with low light intensity. Moreover, having the same set of pixel cells to perform both 2D and 3D sensing can facilitate the correspondence between a 2D image and a 3D image generated by the pixel cells, especially where the pinned photodiodes of each pixel cell detect and measure light of different wavelengths simultaneously within the same exposure period. Moreover, given that every pixel cell of a pixel cell array can be used to generate the 2D or 3D image, the full spatial resolution of the pixel cell array can be utilized. As a result, the spatial resolutions of the images can also be improved, while the form factor and power consumption of the image sensor can be reduced.

The proposed pixel structure, which employs a gate to control the electrical potential of the barrier layer to regulate flow of charge from the second photodiode to the first photodiode, can also provide additional advantages. For example, compared with a case where a conductive deep trench isolation (C-DTI) is used to control the electrical potential of the barrier layer, a gate can have a much bigger aspect ratio than the DTI structure and can be fabricated using standard and relatively inexpensive processes. Further, the gate can be positioned strategically (e.g., at the center line of the photodiode stack) to facilitate the flow of the majority of the charge via the barrier layer, as explained above.

Examples of the present disclosure may include, or be implemented in conjunction with, an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HIVID) connected to a host computer system, a standalone HIVID, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120*a*, 120*b*, 120*c*, and 120*d*. Each of image sensors 120*a*, 120*b*, 120*c*, and 120*d* may include a pixel cell array comprising an array of pixel cells and configured to generate image data representing different fields of views along different directions. For example, sensors 120*a* and 120*b* may be configured to provide image data representing two field of views towards a direction A along the Z axis, whereas sensor 120*c* may be configured to provide image data representing a field of view towards a direction B along the X axis, and sensor 120*d* may be configured to provide image data representing a field of view towards a direction C along the X axis.

In some embodiments, sensors 120*a*-120*d* can be configured as input devices to control or influence the display content of the near-eye display 100, to provide an interactive VR/AR/MR experience to a user who wears near-eye display 100. For example, sensors 120*a*-120*d* can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120*a*-120*d* can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120*a*-120*d* in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more details below, sensors 120*a*-120*d* can be operated in a first mode for 2D sensing and in a second mode for 3D sensing at different times. The 2D and 3D image data can be merged and provided to a system to provide a more robust tracking of, for example, the location of the user, the head movement of the user, etc.

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140*a*, 140*b*, 140*c*, 140*d*, 140*e*, and 140*f*. Near-eye display 100 further includes a plurality of image sensors 150*a* and 150*b*. Illuminators 140*a*, 140*b*, and 140*c* may emit lights of certain optical frequency range (e.g., NIR) towards direction D (which is opposite to direction A of FIG. 1A). The emitted light may be associated with a certain pattern, and can be reflected by the left eyeball of the user. Sensor 150*a* may include a pixel cell array to receive the reflected light and generate an image of the reflected pattern. Similarly, illuminators 140*d*, 140*e*, and 140*f* may emit NIR lights carrying the pattern. The NIR lights can be reflected by the right eyeball of the user, and may be received by sensor 150*b*. Sensor 150*b* may also include a pixel cell array to generate an image of the reflected pattern. Based on the images of the reflected pattern from sensors 150*a* and 150*b*, the system can determine a gaze point of the user, and update the image data provided to display 100 based on the determined gaze point to provide an interactive experience to the user. In some examples, image sensors 150*a* and 150*b* may include same pixel cells as sensors 120*a*-120*d*.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
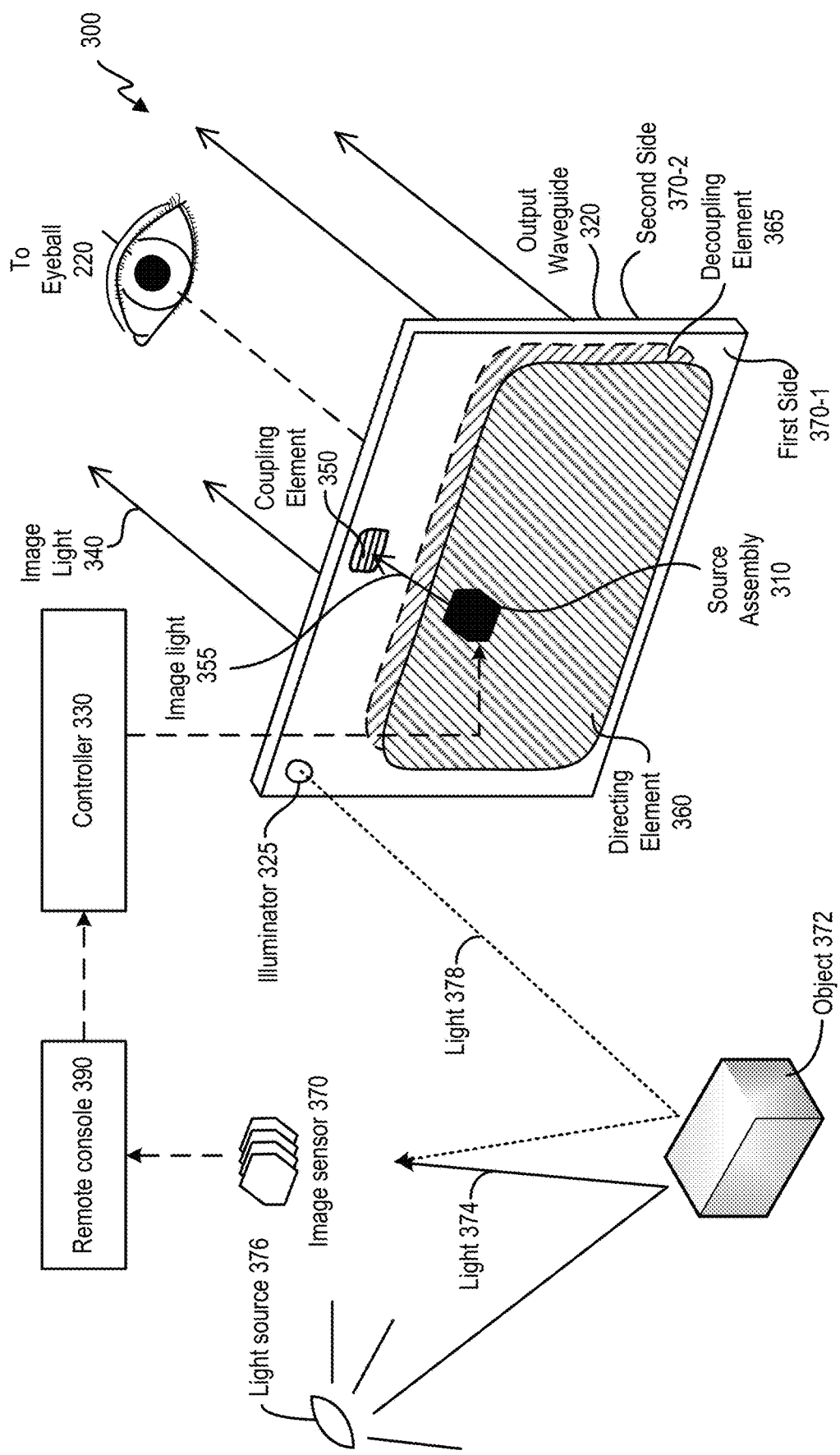
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
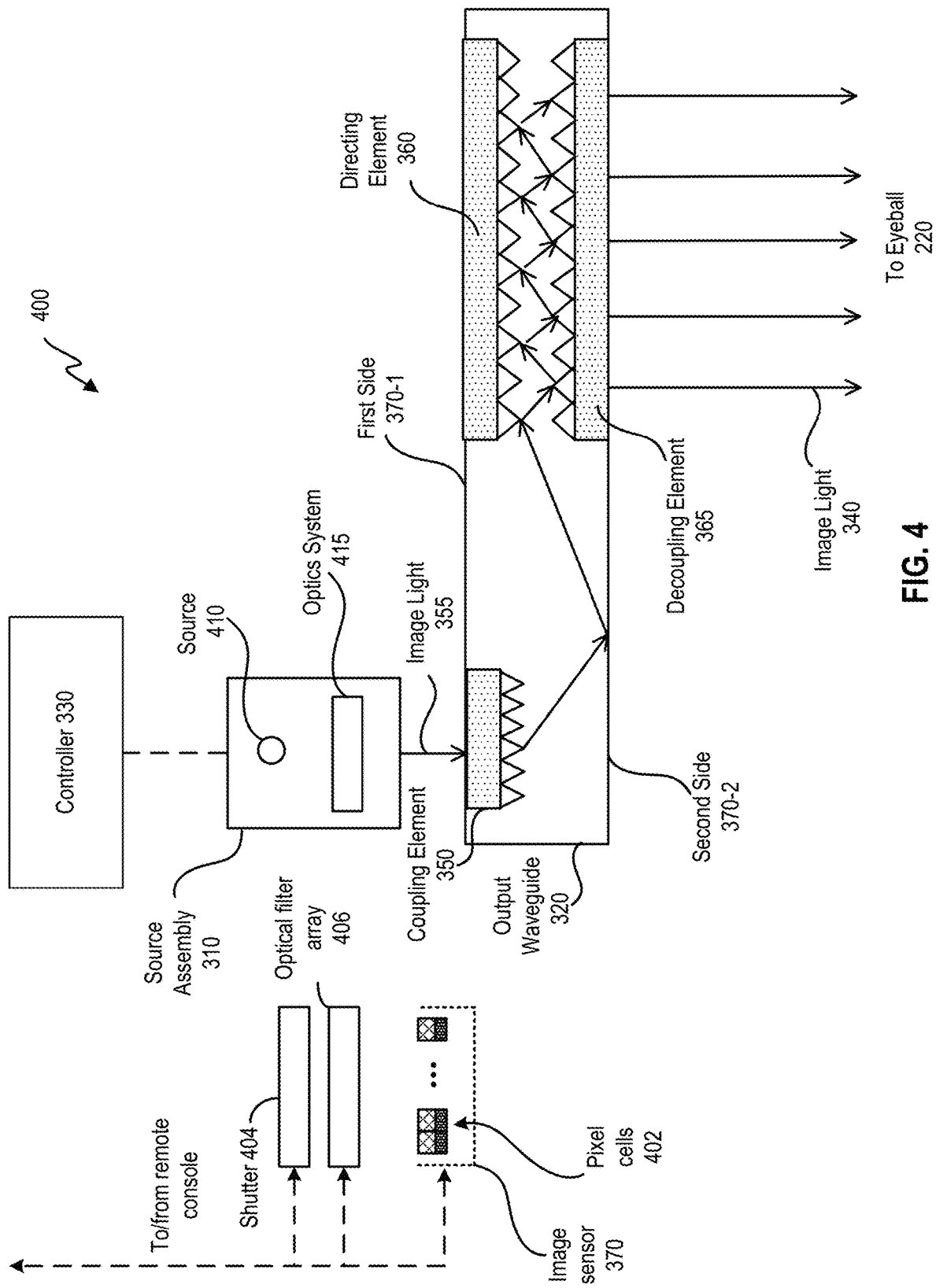
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
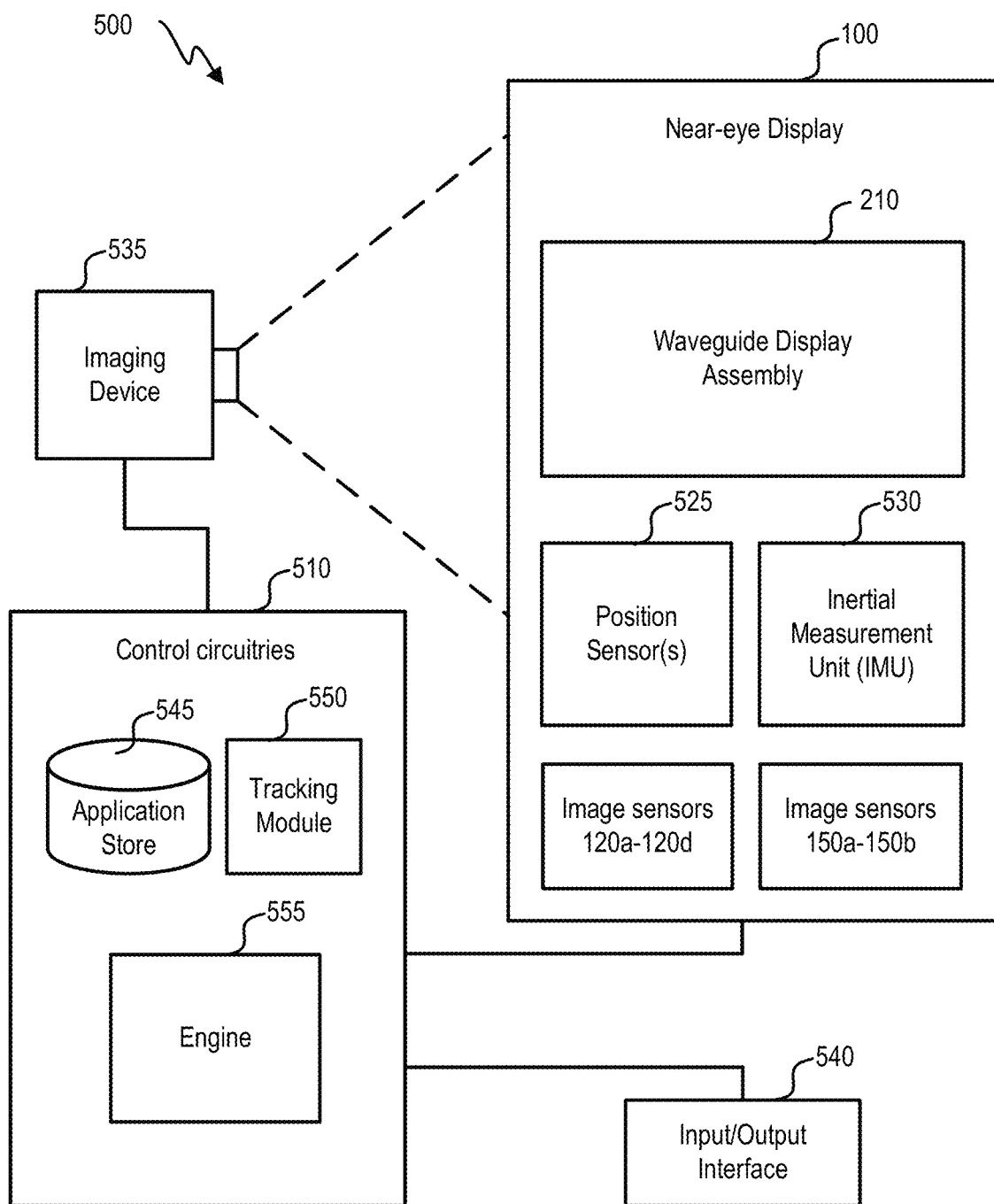
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6:
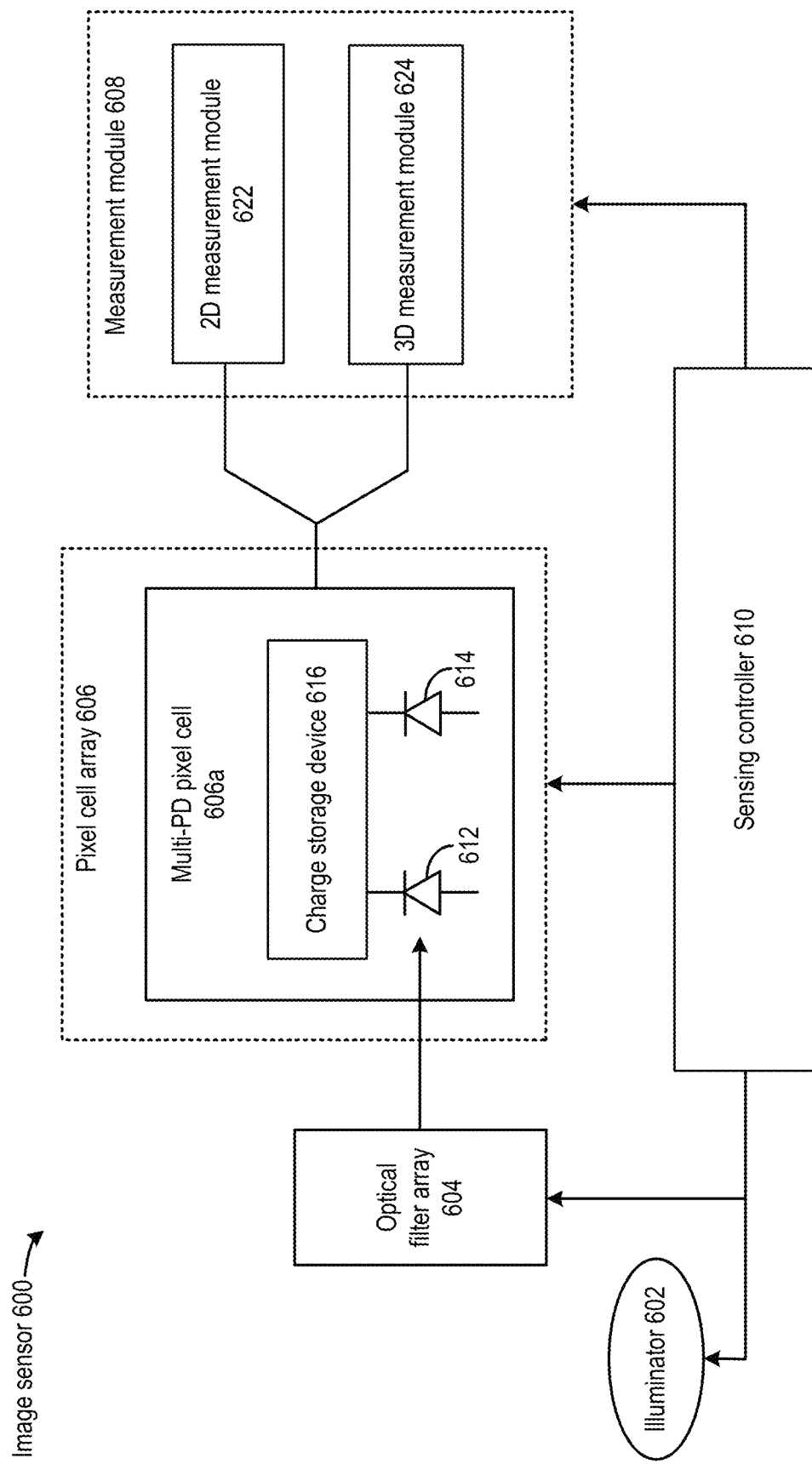
FIG. 6 illustrates an example of an image sensor including a multi-photodiode pixel cell.

FIG. 6 illustrates an example of an image sensor 600. Image sensor 600 can use the same pixel cell for both 2D sensing and 3D sensing. For example, the same pixel cell can be configured to detect a color component (e.g., red, green, or blue color) of visible light for 2D sensing, and to detect infra-red light for 3D sensing. Image sensor 600 can be part of near-eye display 100, and can provide 2D and 3D image data to control circuitries 510 of FIG. 5 to control the display content of near-eye display 100. In the example of FIG. 6, image sensor 600 may include an illuminator 602, an optical filter array 604, a pixel cell array 606, including a pixel cell 606a, and a digitizer module 608.

Illuminator 602 may be an infra-red illuminator, such as a laser, a light emitting diode (LED), etc., that can project infra-red light for 3D sensing. The projected light may include, for example, structured light, light pulses, etc. Optical filter array 604 may include an array of filter elements, with each filter element corresponding to a pixel cell of pixel cell array 606 (e.g., pixel cell 606a). Each filter element can be configured to absorb a certain wavelength range of incident light and transmit the rest of the light to the corresponding pixel cell. The incident light may include ambient visible light as well as infra-red light projected by illuminator 602 and reflected by an object. For example, one filter element may transmit a green component of visible light as well as the infra-red light to a pixel cell, whereas another filter element may transmit a blue component of visible light as well as the infra-red light to another pixel cell. In some examples, optical filter array 604 may be configurable to select the color component of visible light to be transmitted with the infra-red light, so that the pixel cell 606a can be used to detect different color components of visible light as well as infra-red light.

Moreover, pixel cell 606a may include multiple photodiodes to detect the different color components of visible light as well as infra-red light of the incident light. For example, as shown in FIG. 6, pixel cell 606a may include a photodiode 612 and a photodiode 614. Photodiode 612 and photodiode 614 can be pinned photodiodes. Photodiode 612 may detect a first component of the incident light of a first wavelength range (e.g., one of red, blue or green colors of visible light), convert the detected photons to charge, and store the charge, within an exposure period. Moreover, photodiode 614 may detect a second component of the incident light of a second wavelength range (e.g., infra-red light), convert the detected photons to charge, and store the charge, within the same or different exposure periods. Pixel cell 606a may further include a charge storage device 616, which can include a floating drain node, a metal capacitor, or a combination of both. At the end of the exposure periods, the charge stored at photodiodes 612 and 614 can be transferred to charge storage device 616 to develop voltages for 2D and 3D sensing.

Image sensor 600 further includes a measurement module 608. Measurement module 608 may further include a 2D measurement module 622 to perform 2D imaging operations based on the charge generated by photodiode 612. The 2D imaging operation may include, for example, generating a pixel value based on the magnitude of the voltage developed at charge storage device 616 which reflects the total quantity of charge stored at photodiode 612 during the exposure period. Measurement module 608 may include a 3D measurement module 624 to perform 3D imaging operations based on the charge generated by photodiode 614. The 3D imaging operations may include, for example, detecting a pattern of structured light reflected by a surface of an object, and comparing the detected pattern with the pattern of structured light projected by illuminator 602 to determine the depths of different points of the surface with respect to the pixel cells array. For detection of the pattern of reflected light, 3D measurement module 624 can generate a pixel value based on the magnitude of the voltage developed at charge storage device 616 which reflects the total quantity of charge stored at photodiode 614 during the exposure period. As another example, 3D measurement module 624 can generate a pixel value representing a time-of-flight measurement of light pulses transmitted by illuminator 602 and reflected by the object.

Figure 7A:
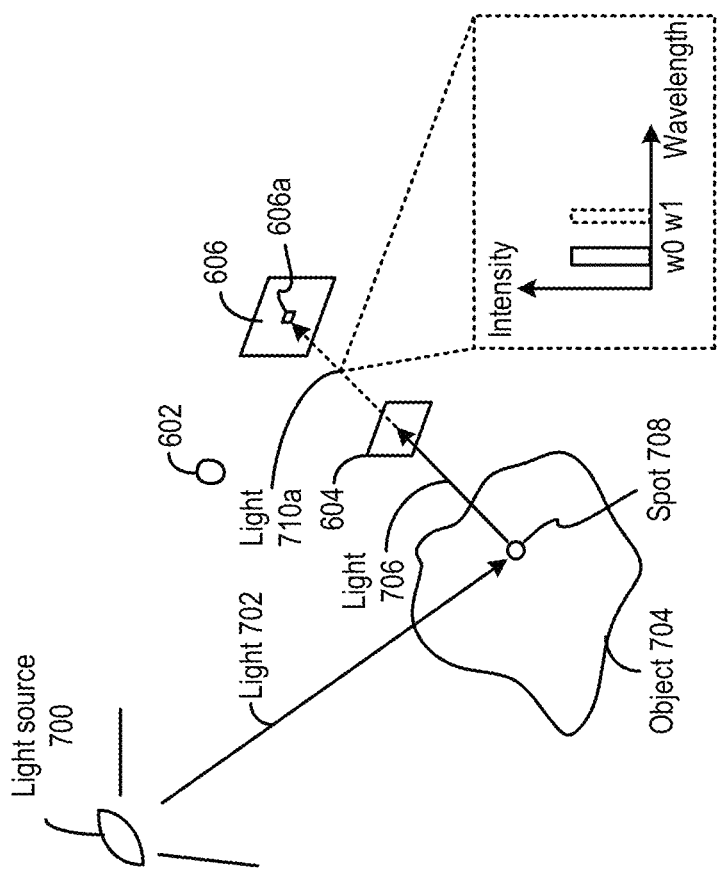
FIG. 7A and FIG. 7B illustrate examples of operations of the image sensor of FIG. 6.
Figure 7B:
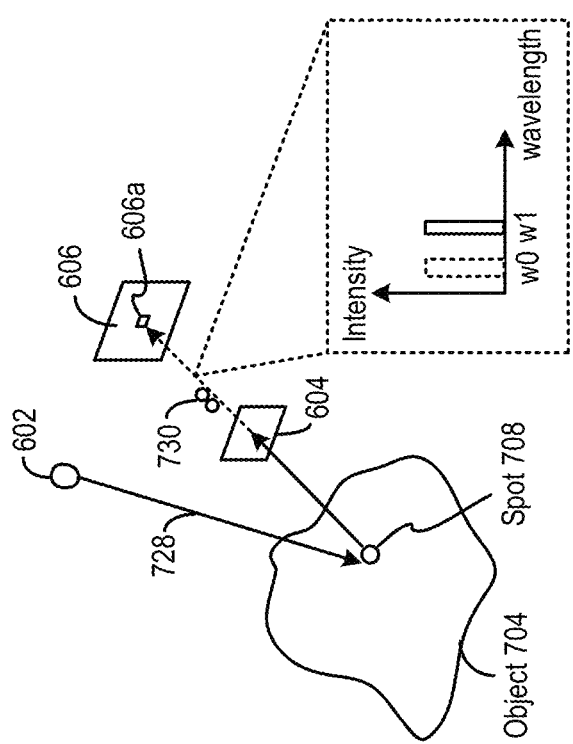

Image sensor 600 further includes a sensing controller 610 to control different components of image sensor 600 to perform 2D and 3D imaging of an object. Reference is now made to FIG. 7A and FIG. 7B, which illustrate examples of operations of image sensor 600 for 2D and 3D imaging. FIG. 7A illustrates an example of operations for 2D imaging. For 2D imaging, pixel cells array 606 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can be filtered by optical filter array 604 to pass a pre-determined wavelength range w0 of the reflected visible light 706, to produce filtered light 710a. Wavelength range w0 may correspond to a first color component of visible light 706 (e.g., a red color component having a wavelength range of 620-750 nanometers (nm)) reflected off spot 708. Filtered light 710a can be captured by first photodiode 612 of pixel cell 606a to generate and accumulate first charge within an exposure period. At the end of the exposure period, sensing controller 610 can steer the first charge to charge storage device 616 to generate the voltage representing the intensity of the first color component, and provide the first voltage to 2D measurement module 622. 2D measurement module 622 may include an analog-to-digital converter (ADC) and can be controlled by sensing controller 610 to sample and quantize the first voltage to generate a digital value representing the intensity of the first color component of visible light 706.

Furthermore, image sensor 600 can also perform 3D imaging of object 704. Referring to FIG. 7B, sensing controller 610 can control illuminator 602 to project infra-red light 728, which can include a light pulse, structured light, etc., onto object 704. Infra-red light 728 can have a wavelength range of 700 nanometers (nm) to 1 millimeter (mm). Infra-red photons 730 can reflect off object 704 and propagate towards pixel cells array 606 and pass through optical filter 604. In some examples, second photodiode 614 of pixel cell 606a can convert infra-red photons 730 into second charge. The detection and conversion of infra-red photons 730 by second photodiode 614 can occur within the same exposure period as the detection and conversion of visible light 706 by first photodiode 612. Such arrangements allow each pixel cell to perform 2D and 3D imaging of the same spot of an object, which can improve the correspondence between the 2D and 3D images. Sensing controller 610 can steer the second charge to charge storage device 616 to generate the a voltage representing the intensity of the infra-red light received at the pixel cell.

3D measurement module 624 can perform different types of depth-sensing operations based on the type of light 728 projected onto object 704. In a case where structured light 728 is projected onto object 704, 3D measurement module 624 may include an ADC and can be controlled by sensing controller 610 to sample and quantize the second voltage to generate a digital value representing the intensity of the infra-red light reflected by spot 708. A pattern of infra-red light intensities reflected by object 704 can be obtained from the digital values. The pattern can be compared with the structured light pattern projected by illuminator 602 to determine the depths of different spots on the surface of object 704, including spot 708, with respect to pixel cells array 606. In a case where infra-red light 728 includes light pulses, 3D measurement module 624 can detect a change of stored charge at second photodiode 614. A time-of-flight of an infra-red light pulse can be determined based on a time difference between when the light pulse exits illuminator 602 and when the change of stored charge at second photodiode 614 is detected. Based on the information provided by each pixel cell, a 3D image of object 704 can be generated.

Figure 8:
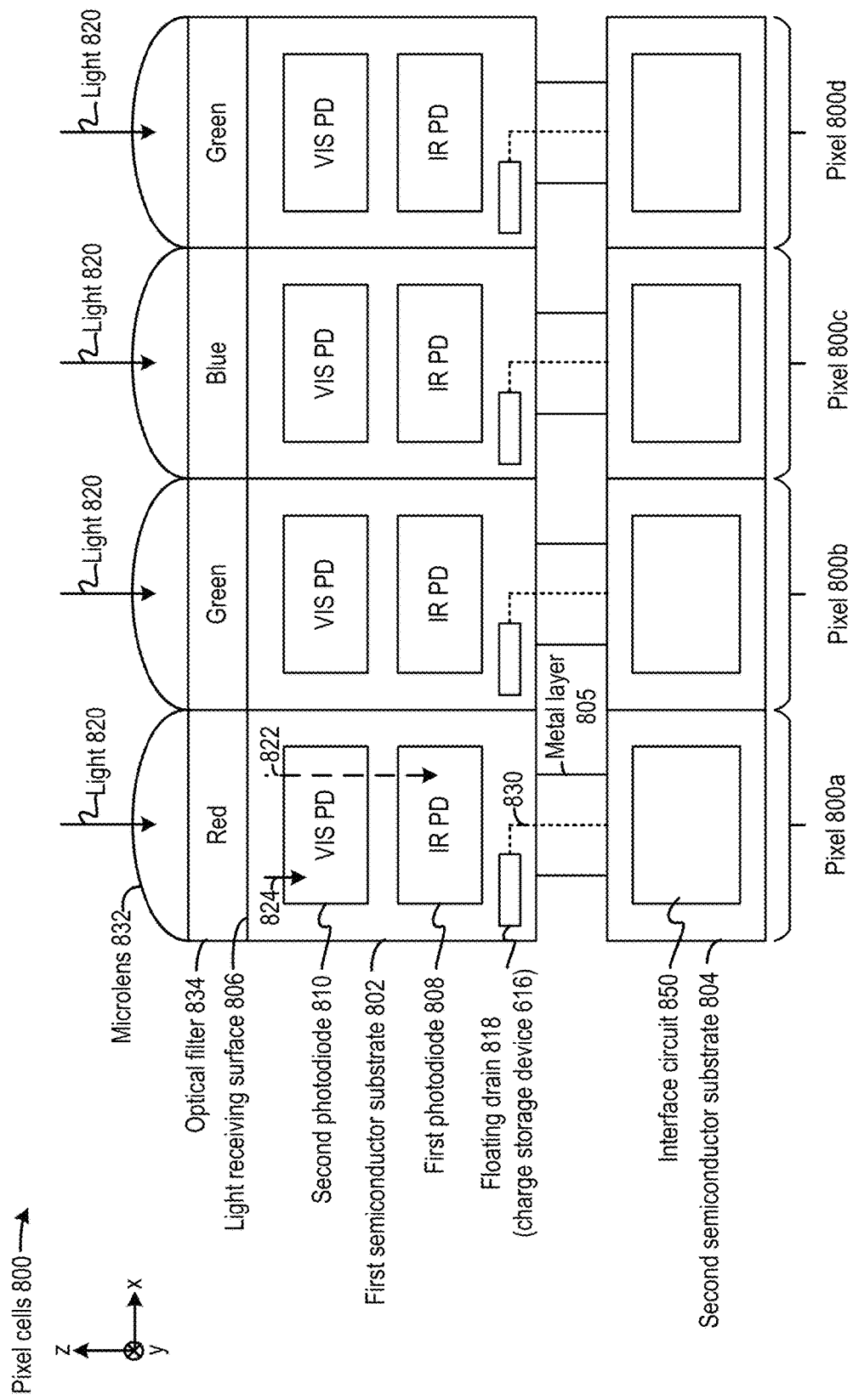
FIG. 8 illustrates an example of an array of pixel cells that can be part of the image sensor of FIG. 6.

FIG. 8 illustrates an example of an array of pixel cells 800 (e.g., pixel cells 800a, 800b, 800c, and 800d) which can perform collocated 2D and 3D image sensing and can be part of image sensor 600. FIG. 8 illustrates a cross-sectional view of array of pixel cells 800 (e.g., viewing from the x/y axes). As shown in FIG. 8, each of pixel cells 800 can include a first semiconductor substrate 802, a second semiconductor substrate 804, as well as a metal layer 805 sandwiched between the substrates. First semiconductor substrate 802 can include a light receiving surface 806, a first photodiode 808, a second photodiode 810, and charge storage device 616, whereas second semiconductor substrate 804 can include an interface circuit 850. In FIG. 8, first semiconductor substrate 802, metal layer 805, and second semiconductor substrate 804 can form a stack along the z-axis. In some examples, first semiconductor substrate 802 and second semiconductor substrate 804 can be the same substrate, or that the two substrates can be arranged laterally along the x/y axes.

Within first semiconductor substrate 802, first photodiode 808 and second photodiode 810 can form a stack along a propagation path of light 820 perpendicular to light receiving surface 806 (e.g., along the z-axis). Second photodiode 810 can be configured as a visible light sensing photodiode ("VIS PD") whereas first photodiode 808 can be configured as an infra-red light sensing photodiode ("IR PD"). Specifically, second photodiode 810 can be closer to light receiving surface 806 than first photodiode 808. As light 820 enters via light receiving surface 806 and propagates within first semiconductor substrate 802, a first light component 822 of light 820 having the relatively longer infra-light wavelength range can propagate through second photodiode 810 to reach and can be absorbed by first photodiode 808. Moreover, a second light component 824 of light 820 having the relatively shorter visible light wavelength range stops at second photodiode 810 and can be absorbed by second photodiode 810.

Each of pixel cells 800 also includes optical components to control the properties of first light component 822 and second light component 824 of light 820. For example, each of pixel cells 800 includes a microlens 832 to focus light 820, as well as an optical filter 834 to select, for example, the wavelength range of second light component 824 (e.g., one of red, green, or blue colors) to be absorbed/measured by second photodiode 810. As shown in FIG. 8, each of pixel cells 800a, 800b, 800c, and 800d can receive infra-red light as first light component 822, but receive visible light of different wavelength ranges as second light component 824 based on the configuration of color filter 834. In the example of FIG. 8, pixel cell 800a may receive red light as second light component 824, pixel cells 800b and 800d may receive green light as second light component 824, whereas pixel cell 800c may receive blue light as second light component 824.

Each of first photodiode 808 and second photodiode 810 can generate charge responsive to, respectively, first light component 822 and second light component 824. The rate of charge generation by each photodiode can represent the intensities of first light component 822 and second light component 824. The charge generated by first photodiode 808 and second photodiode 810 can be stored in charge storage device 616 which, in the example of FIG. 8, can include a floating drain 818 in first semiconductor substrate 802. The quantity of charge accumulated in charge storage device 616, as well as the rate of charge accumulation in charge storage device 616, can be measured by interface circuit 850. Interface circuit 850 may include a controller to control the flow of charge from first photodiode 808 and second photodiode 810 to floating drain 818 for read out. Interface circuit 850 further include measurement module 608 of FIG. 6 to read out and quantize the charge from first photodiode 808 and second photodiode 810 to determine, for example, the intensities of first light component 822 and second light component 824. Metal layer 805 further includes metal interconnects 830 which can couple floating drain node 818 with measurement module 608 of second semiconductor substrate 804. Metal interconnects 830 can also couple the controller with circuits in first semiconductor substrate 802 that regulate the flow of charge. Metal interconnects 830 can transmit voltages developed at charge storage device 616 corresponding to the charge generated by first photodiode 808 and second photodiode 810 to measurement module 608 to perform measurements for the 2D and 3D image sensing operations as described above.

Figure 9A:
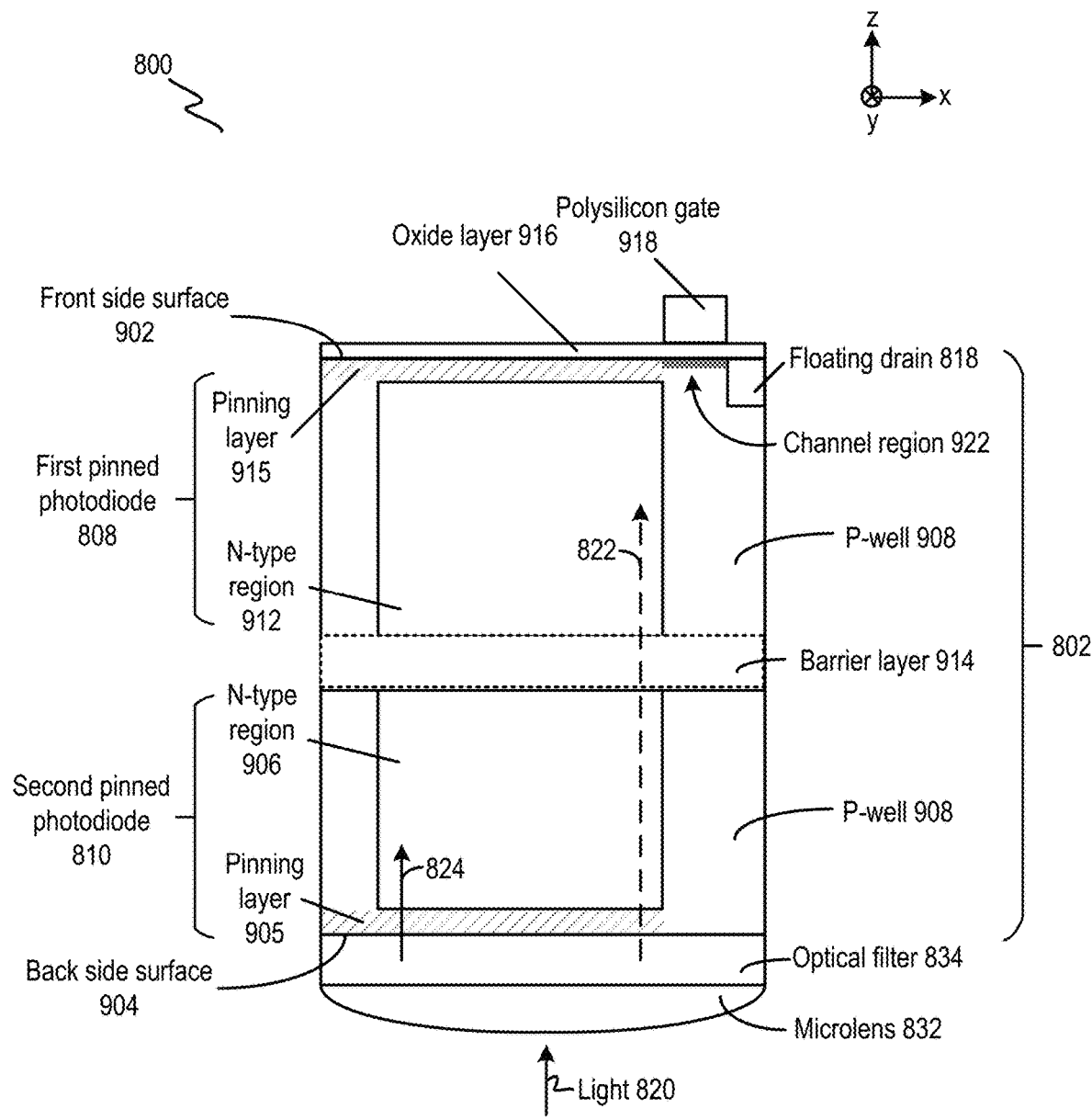
FIG. 9A and FIG. 9B illustrate examples of internal components of pixel cell of FIG. 8.
Figure 9B:
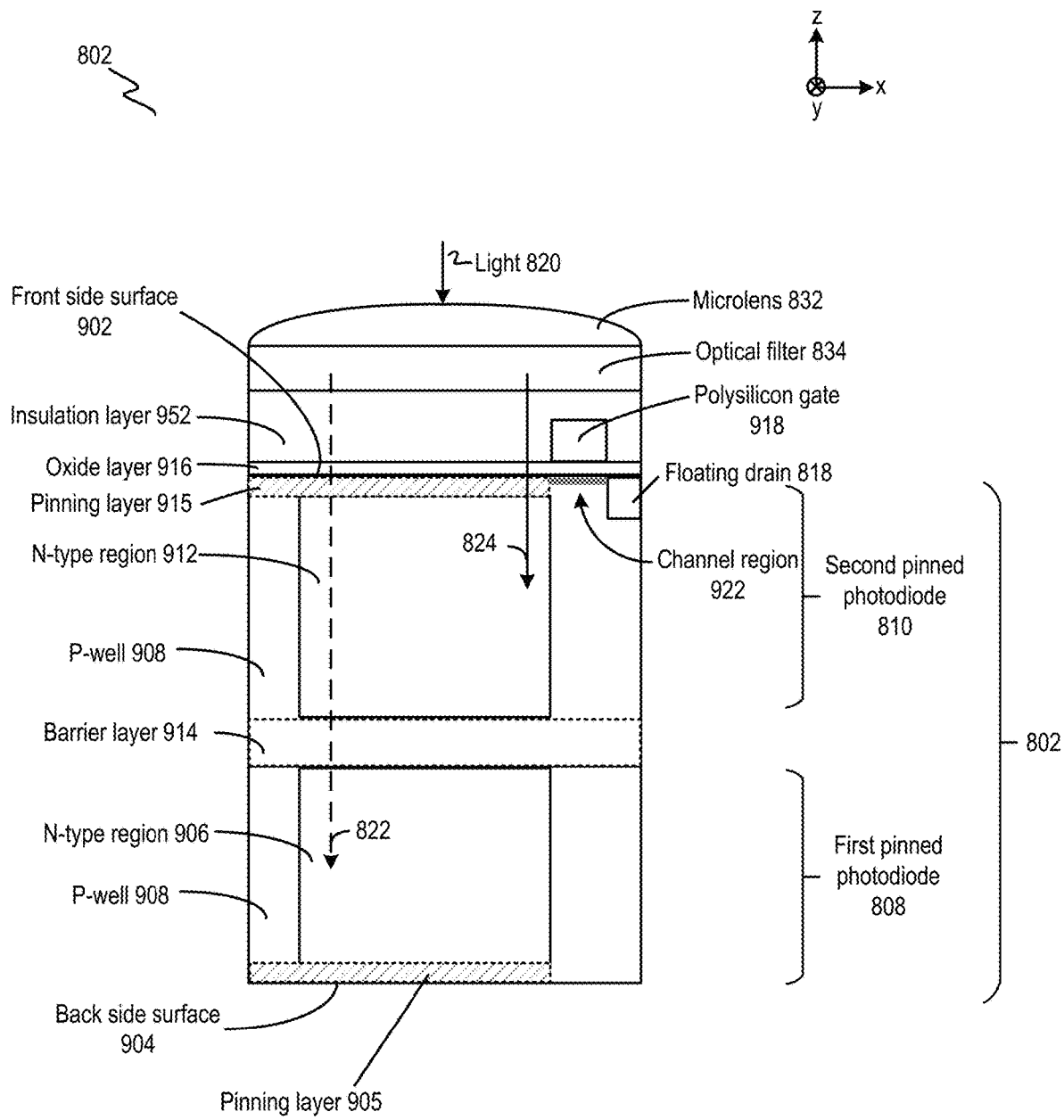

Reference is now made to FIG. 9A and FIG. 9B, which provide illustrate examples of additional components of pixel cell 800. FIG. 9A and FIG. 9B illustrate a cross-sectional view of array of pixel cells 800 (e.g., viewing from the x/y axes). In FIG. 9A and FIG. 9B, semiconductor substrate 802 can be a P-type substrate and have a front side surface 902 and a back side surface 904. Front side surface 902 is where additional semiconductor processing, such as formation of polysilicon gate 918, doping and/or ion implantation to form first photodiode 808, second photodiode 810, floating drain node 818, pinning layers 905 and 915, etc. In FIG. 9A, pixel cell 800 can be configured as a back side illuminated device, in which back side surface 904 is configured as light receiving surface 806, and microlens 832 and optical filter 834 can be placed on back side 904 surface to control the properties of first light component 822 and second light component 824 of light 820. In FIG. 9B, pixel cell 800 can be configured as a front side illuminated device, in which front side surface 902 is configured as light receiving surface 806. An insulation layer 952 can be put over polysilicon gate 918 and oxide layer 916 on front side surface 902, and microlens 832 and optical filter 834 can be placed on insulation layer 952 to control the properties of first light component 822 and second light component 824 of light 820.

In the examples of FIG. 9A and FIG. 9B, first photodiode 808 and second photodiode 810 can be configured as pinned photodiodes. In FIG. 9A, second pinned photodiode 810 can be formed by including an N-type region 906 and P-type pinning layer 915 embedded within P-type semiconductor substrate 802. Pixel cell 800 further includes a P-well 908 and an N-type region 912 and P-type pinning layer 905 embedded within P-well 908 to form first pinned photodiode 808. In FIG. 9A, N-type region 912 is further away from back side surface 904 (configured as light receiving surface 806) than N-type region 906, which allows first pinned photodiode 808 to primarily detect an infra-red component (e.g., first light component 822) of light 820 and second pinned photodiode 810 to primarily detect a visible light component (e.g., second light component 824) of light 824.

In FIG. 9B, the positions of first pinned photodiode 808 and second pinned photodiode 810 can be reversed, with first pinned photodiode 808 formed from N-type region 906 whereas second pinned photodiode 810 formed from N-type region 912. In FIG. 9B, N-type region 912 is closer to front side surface 902 (configured as light receiving surface 806) than N-type region 906, which allows first pinned photodiode 808 and second pinned photodiode 810 to detect components of different wavelengths as in FIG. 9A. First pinned photodiode 808 and second pinned photodiode 810 can have the same or different pinning voltages (e.g., maximum voltage difference across the photodiodes). In both first pinned photodiode 808 and second pinned photodiode 810, the complete isolation of N-type region 906 and N-type region 912 within P-type substrate 901 and P-well 908 can provide better dark-current and noise performance.

In both FIG. 9A and FIG. 9B, a barrier layer 914 is also formed between first pinned photodiode 808 and second pinned photodiode 810, and first pinned photodiode 808, barrier layer 914, and second pinned photodiode 810 can form a stack along a direction of propagation of light within P-type semiconductor substrate 802 (e.g., along the z-axis). The photodiodes 808 and 810 and barrier layer 914 can be formed by, for example, ion implantation from front side surface 902. As to be described in more detail below, barrier layer 914 can prevent a charge stored in first pinned photodiode 808 from entering second pinned photodiode 810. Barrier layer 914 can also regulate flow of charge from second pinned photodiode 810 to first pinned photodiode 808 for read out and quantization. In some examples, barrier layer 914 can be a P-type layer and be part of P-well 908 (or P-type semiconductor substrate 802), or can be part of a P+ region with a higher P-type doping concentration. In some examples, barrier layer 914 can also be an N-type layer (e.g., having a lower N-type doping concentration than both N-type region 906 and N-type region 912).

As described above, pixel cell 800 further includes pinning layers 905 and 915, oxide layer 916, polysilicon gate 918, and floating drain 818. Pinning layer 915 can be configured to separate N-type region 912 from directly interfacing with oxide layer 916 to reduce dark current caused by surface-hole combination at the interface between oxide layer 916 and the substrate, which can reduce the dark signal generation at first photodiode 808. In addition, pinning layer 905 can separate N-type region 906 from directly interfacing with back side surface 904 (which may interface with another oxide layer, optical filter 834, etc.) to reduce the dark signal generation at second photodiode 810. Pinning layers 915 and 905 can also form the P-type region of, respectively, first photodiode 808 and second photodiode 810. Polysilicon gate 918 can receive a voltage and exert an electric field, via oxide layer 916, to create a channel at a channel region 922 between N-type region 912 and floating drain 818. The channel can be created to read out a charge generated by one of the first photodiode 808 or second photodiode 810.

Figure 10:
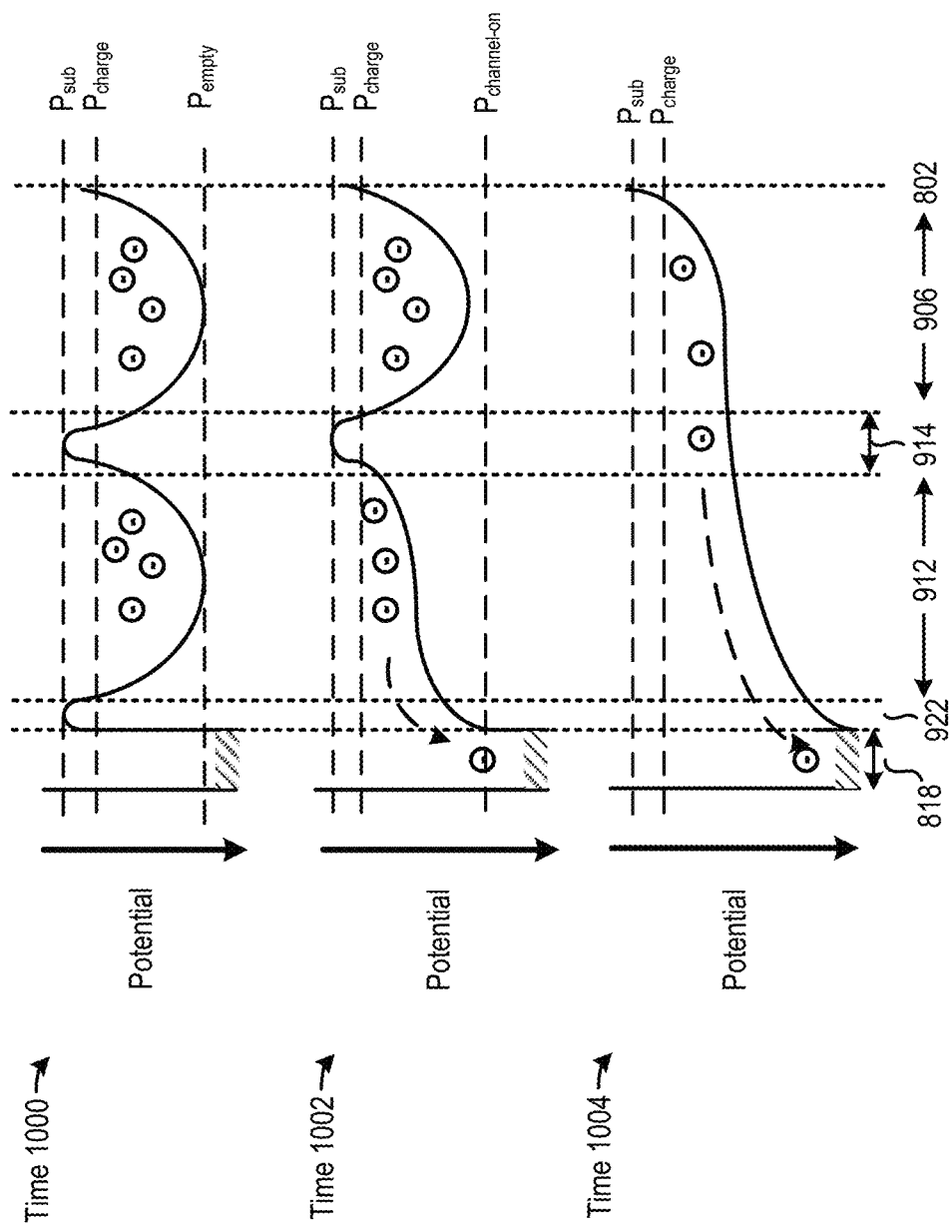
FIG. 10 illustrates examples of electrical potential distributions for read out of charges from the array of pixel cells of FIG. 8.

FIG. 10 illustrates an example of electrical potential distributions within first semiconductor substrate 802 for read out of charge from first or second photodiodes 808 and 810. Referring to FIG. 10, the electrical potential of barrier layer 914 can be modulated with respect to time to perform the read out. As shown in FIG. 10, at time 1000, N-type region 912 and N-type region 906 store negative charged generated in response to first and second light components 822 and 824, and each can have an electrical potential $P_{charge}$. The electrical potential $P_{charge}$ can be defined based on the quantity of charge, the capacities of the quantum wells of N-type region 912 and N-type region 906, and the electrical potential of the quantum wells when they are empty, $P_{empty}$. Meanwhile, channel region 922 can be in an off state and a channel is not yet created at channel region 922. The electrical potential at channel region 922 can be at an electrical potential lower than $P_{charge}$. Moreover, barrier layer 914 can be in an off-state and can be set at an electrical potential to prevent charge from flowing between N-type region 912 and N-type region 906, and the electrical potential at N-type region 912 can also be at an electrical potential lower than $P_{charge}$. In FIG. 10, the electrical potentials at channel region 922 and barrier layer 914 can be similar to $P_{sub}$.

At time 1000, the storage capacities of both N-type region 912 and N-type region 906 can be at the maximum. The maximum quantity of charge that can be stored in N-type region 912 can be defined based on the quantum well capacity of N-type region 912, and the electric potentials of channel region 912 and barrier substrate 914 when both are in the off-state. With such arrangements, when the maximum quantity of charge is stored in N-type region 912, $P_{charge}$ can remain higher than the electrical potentials of both barrier substrate 914 and channel region 912 to trap the charge in N-type region 912. As to be described in details below, the electrical potential at channel region 922 can be configured to set the storage capacity of N-type region 912. Moreover, the maximum quantity of charge that can be stored in N-type region 906 can be defined based on the quantum well capacity of N-type region 906, the electrical potential $P_{sub}$ of first semiconductor substrate 802, and the electrical potential of barrier substrate 914 in the off-state, as well as $P_{empty}$, such that when the maximum quantity of charge is stored in N-type region 906, $P_{charge}$ remains higher than the potentials of both first semiconductor substrate 802 and barrier layer 914 to trap the charge in N-type region 906.

At time 1002, the charge stored in N-type region 912 can be read out. To read out the charge, the electrical potential in channel region 922 can be increased to $P_{channel-on}$ by applying a voltage at polysilicon gate 918 to form a channel at channel region 922. Negative charge stored in N-type region 912 can flow to channel region 922 and then floating drain 818. Meanwhile, the electrical potential of barrier 914 remains at $P_{sub}$ which is lower than the electrical potential $P_{charge}$ of charge stored at N-type region 906. As a result, the charge stored at N-type region 906 remains trapped at the region.

At time 1004, the electrical potential of barrier layer 914 can be increased to be equal to or higher than $P_{charge}$. The charge stored at N-type region 906 can flow to N-type region 912. In the example of FIG. 10, the electrical potential in channel region 922 can be maintained at $P_{channel-on}$ and all of the charge from N-type region 906 can be transferred to floating drain 818. In some examples, as to be described below, the charge stored at N-type region 906 can be transferred to floating drain 818 in multiple steps for measurement operations for different light intensities.

Figure 11A:
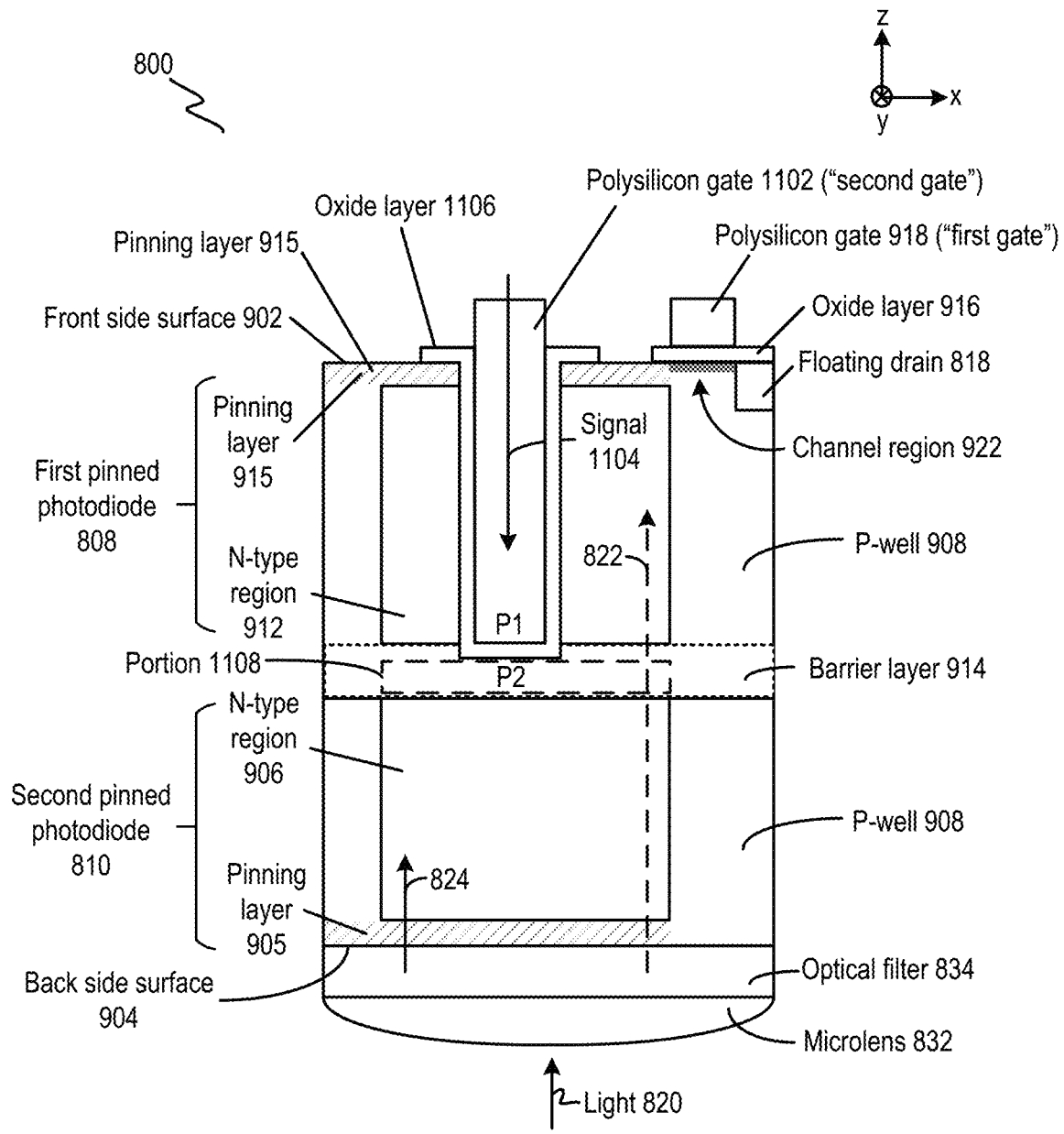
FIG. 11A and FIG. 11B illustrate examples of internal components of pixel cell of FIG. 8.
Figure 11B:
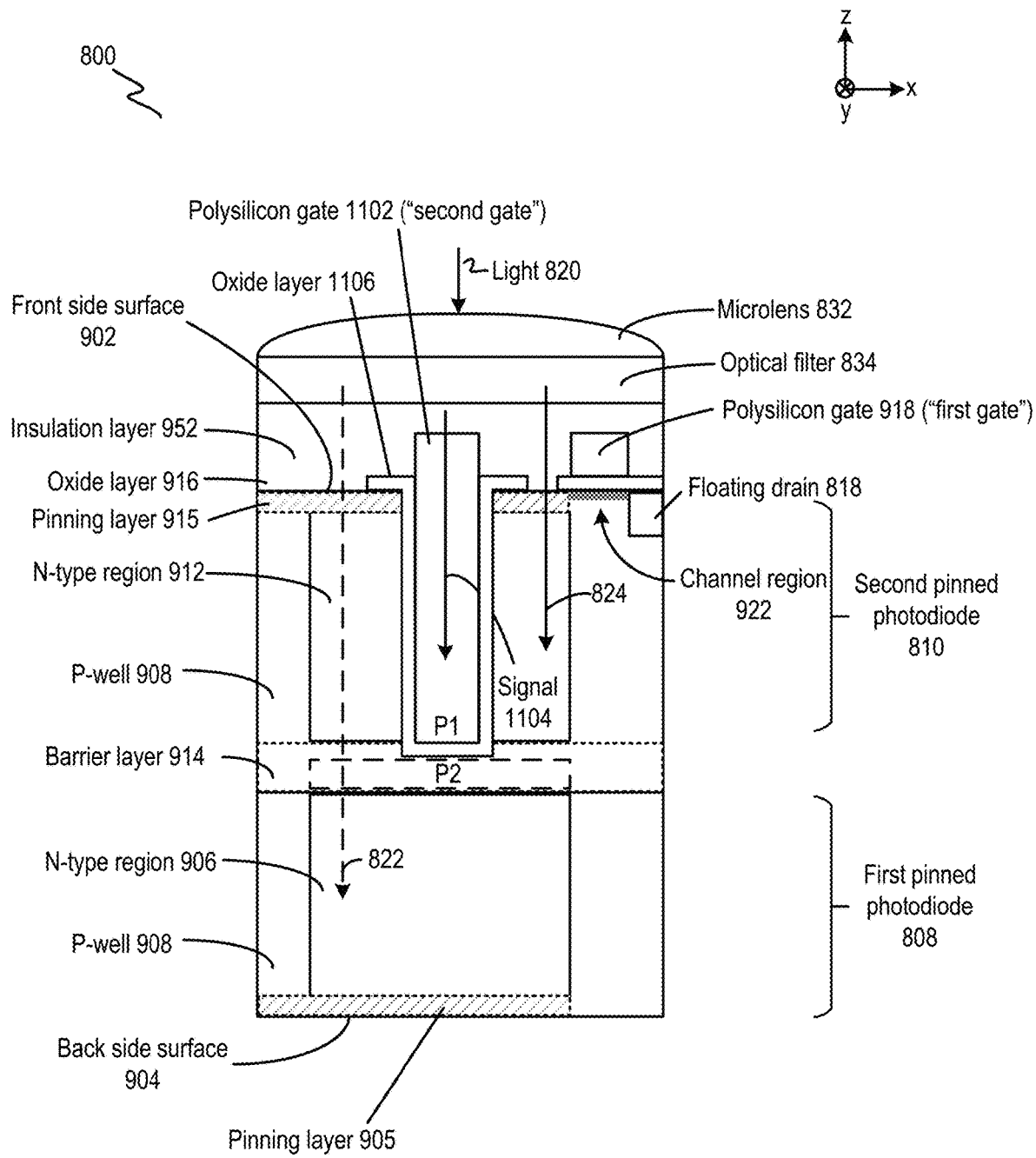

FIG. 11A and FIG. 11B illustrate cross-sectional views of pixel cell 800 which include additional components to modulate the electrical potential of barrier layer 914. FIG. 11A illustrates pixel cell 800 configured as a back side illuminated device, whereas FIG. 11B illustrates pixel cell 800 configured as a front side illuminated device. As shown in FIG. 11A and FIG. 11B, in addition to polysilicon gate 918 (herein after, "first gate"), pixel cell 800 can include a polysilicon gate 1102 (herein after, "second gate") that extends from front side surface 902 into first semiconductor substrate 802. Second gate 1102 can be used to modulate the electrical potential of barrier layer 914. Specifically, second gate 1102 can extend along an axis parallel with the propagation of light within the stack of first photodiode 808, barrier layer 914, and second photodiode 810 (e.g., along the z-axis), and can intersect first photodiode 808 to reach barrier layer 914. Pixel cell 800 can include an oxide layer 1106 to insulate second gate 1102 from first photodiode 808 and barrier layer 914. N-type regions 906 and 912, P-well 908, and barrier layer 914 are all connected to first semiconductor substrate 802 and can be biased at a bias voltage (e.g., 0 v). Second gate 1102 can receive a signal 1104, from which an electrical potential P1 can be developed at an end of second gate 1102 closest to portion 1108 of barrier layer 914. Depending on the relationship between electrical potential P1 and the bias voltage of barrier layer 914, positive or negative charge can accumulate at portion 1108, and an electrical potential P2 can be developed at portion 1108. Referring to the example of FIG. 10, signal 1104 can include a negative voltage to develop a negative electrical potential P1, which can attract positive charge and increase the electrical potential P2 at portion 1108 of barrier layer 914. With increased electrical potential P2, charge can flow from N-region 906 (of second photodiode 810 in FIG. 11A, of first photodiode 808 in FIG. 11B) to N-region 912 (of first photodiode 808 in FIG. 11A, of second photodiode 810 in FIG. 11B) for read out.

Figures 12A, 12B:
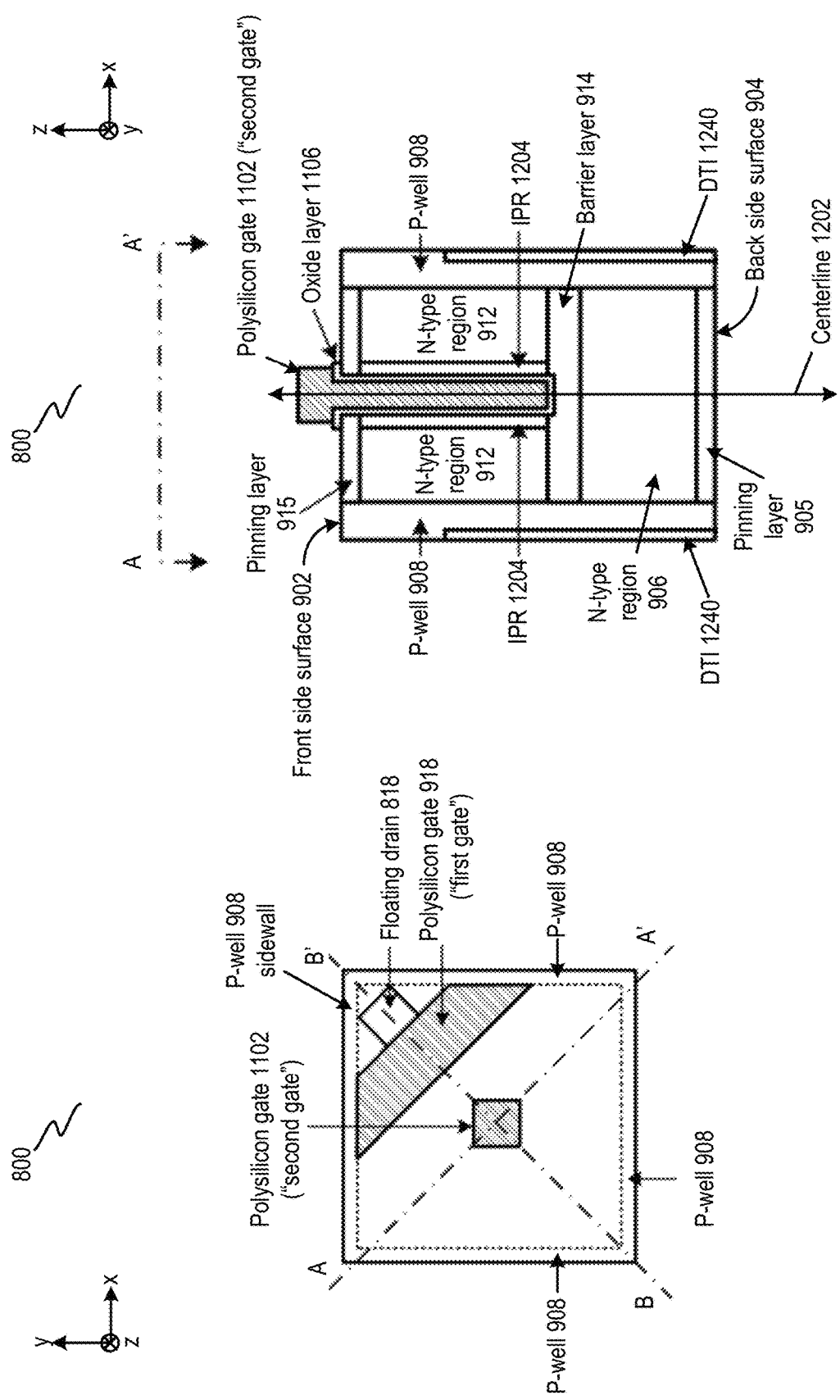
FIG. 12A, FIG. 12B, FIG. 12C, FIG. 12D, FIG. 12E, and FIG. 12F illustrate examples of internal components of pixel cell of FIG. 8.
Figure 12D:
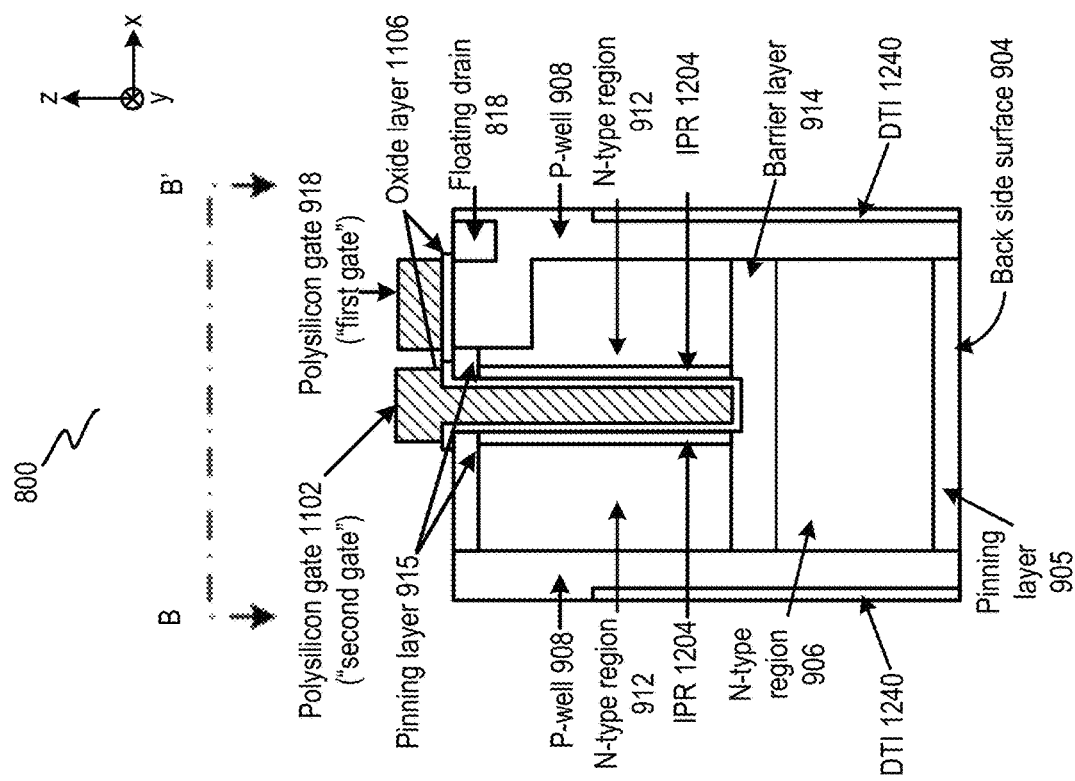
Figure 12C:
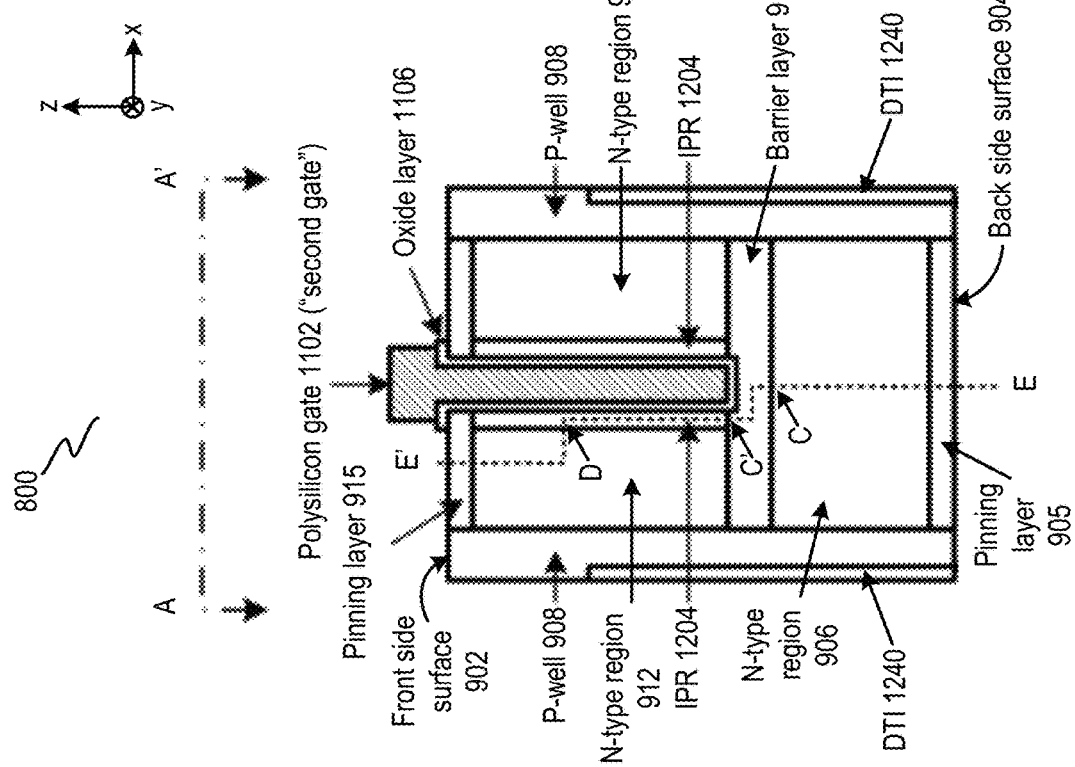
Figure 12E:
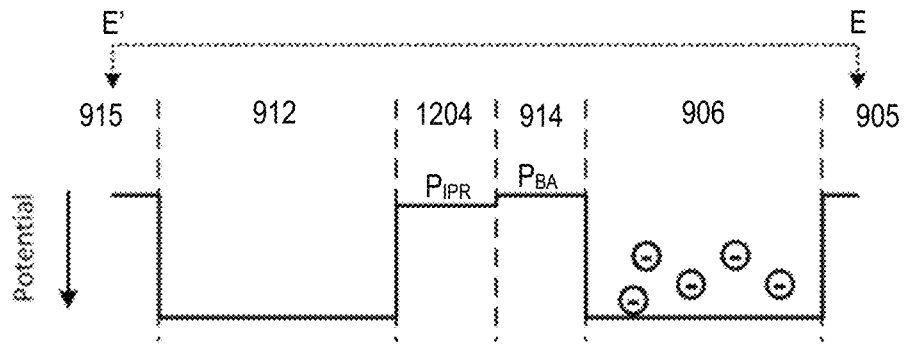

FIG. 12A-FIG. 12F illustrate additional features that can be part of pixel cell 800. FIG. 12A illustrates a top view (e.g., viewing from the z-axis) of pixel cell 800 having a back side illumination configuration, whereas each of FIG. 12B, FIG. 12C, and FIG. 12D illustrates a cross-sectional view of pixel cell 800. FIG. 12B and FIG. 12C illustrate the cross-sectional view along an imaginary cutline A-A' that intersects second gate 1102, whereas FIG. 12C illustrates the cross-sectional view along an imaginary cutline B-B' that intersects second gate 1102, first gate 918, and floating drain 818.

Referring to FIG. 12A and FIG. 12B, second gate 1102 can be positioned at or near a centerline 1202 of the stack of first photodiode 808, barrier layer 914, and second photodiode 810. In a case where P-well 908 surrounds the stack and forms a sidewall on each of the four sides of pixel cell 800, centerline 1202 can be of equal distance to two or more of the sidewalls. Such arrangements can facilitate the flow of the charge from second photodiode 810 to first photodiode 808 via barrier layer 914 (or the flow of charge from first photodiode 808 to second photodiode 810 via barrier layer 914 in the front side illumination configuration). Specifically, due to the focusing effect of microlens 832, the intensities of first light component 822 and second light component 824 are typically the highest at centerline 1202 as both light components propagate within the stack. The concentration of charge generated from conversion of photons of first light component 822 and second light component 824 is also typically the highest at centerline 1202. Therefore, positioning second gate 1102 over at centerline 1202 of the stack allows adjustment of the electrical potential of barrier layer 914 also at the centerline, which is closest to the majority of the charge in each of first photodiode 808 and second photodiode 810. As shown in FIG. 12C, with such arrangements, a short propagation path, represented by a dotted line of labels C-C', can be provided across barrier layer 914 for the majority of the charge in second photodiode 810, which can facilitate the flow of the charge from second photodiode 810 to first photodiode 808 via barrier layer 914.

Referring to FIG. 12B and FIG. 12C, pixel cell 800 can include an interface passivation region (IPR) 1204 surrounding the interface between oxide layer 1106 and first photodiode 808. IPR 1204 can accumulate charge to reduce dark current. Specifically, crystalline defects may exist at the interface between oxide layer 1106 and the N-type region 912 of first photodiode 808, from which dark current can be generated. IPR 1204 can be created by accumulating charge to fill the crystalline defects to reduce dark current. The charge accumulated at IPR 1204 is of opposite polarity to the charge converted by the photodiodes from photons. For example, in a case where negative charge are generated by the photodiodes from first light component 822 and second light component 824 and transferred to floating drain 818 for read out, positive charge can be accumulated at the interface to form a P-type IPR 1204. As shown in FIG. 12C, IPR 1204 and barrier layer 914 can form a P-type conduction path, represented by a dotted line of labels C'-D, as part of the path of the charge, represented by a dotted line of labels E-E', from second photodiode 810 to first photodiode 808. As dark signal can be generated from the dark current and can be read out at floating drain 818 as a noise component, the formation of IPR 1204 can reduce the noise component and improve the accuracy of light intensity measurement.

There are various of forming IPR 1204. In one example, IPR 1204 can be performed as part of the fabrication process of second gate 1102. Specifically, Second gate 1102 can be formed by etching a hole into first semiconductor substrate 802 from front side surface 902 along centerline 1202. The etching time can be determined based on the depth of second gate 1102 into first semiconductor substrate 802, which in turn can be determined based on the depth of barrier layer 914 with respect to front side surface 902. After the etching of the hole completes (e.g., when the hole reaches the target depth), a P-type dopant can be introduced via the hole to the region of first semiconductor substrate 802 surrounding the hole to form P-type IPR 1204. The dopant can be introduced by, for example, diffusion, ion implantation, etc. After IPR 1204 is formed, oxide layer 1106 can be formed as lining to cover the side walls of the hole. Oxide layer 1106 can be formed by, for example, thermal oxidation. The hole lined with oxide layer 1106 can then be filled with polysilicon to form second gate 1102. In another example, IPR 1204 can be formed based on applying a bias voltage at second gate 1102. For example, to accumulate positive charge at IPR 1204, a negative bias voltage can be applied at second gate 1102.

As described above, IPR 1204 and barrier layer 914 can form a P-type conduction path. Charge can flow across IPR 1204 and barrier layer 914 when signal 1104 comprising a positive voltage is applied to second 1102. The positive voltage can push the positive charge carrier carriers away from IPR 1204 and barrier layer 914 to form a channel of negative charge between the N regions of second photodiode 810 and first photodiode 808. To ensure that negative charge flows through the channel, IPR 1204 and barrier layer 914 can be configured to maintain a potential gradient along the direction of flow of the negative charge. For example, referring to FIG. 12E, IPR 1204 can be configured to maintain a higher electrical potential PIPR than the electrical potential PBA of barrier layer 914, such that negative charge from second photodiode 810 can flow from a relatively lower electrical potential (at barrier layer 914) to a relatively higher electrical potential (at IPR 1204).

Various techniques can be employed to set the relative electrical potential between IPR 1204 and barrier layer 914. In some examples, IPR 1204 and barrier layer 914 can have different doping profiles. For example, IPR 1204 can have a higher P-type dopant concentration than barrier layer 914. As another example, IPR 1204 can be doped with P-type dopants, whereas barrier layer 914 can be doped with N-type dopants. In these examples, due to the different dopant concentrations, opposite charge can diffuse between IPR 1204 and barrier layer 914. The displacement of charge gives rise to a built-in electric field to pull back the charge. A built-in electrical potential difference between IPR 1204 and barrier layer 914 may result when an equilibrium is reached between the diffusion of the charge and the pull back of the charge by the electric field.

Figure 12F:
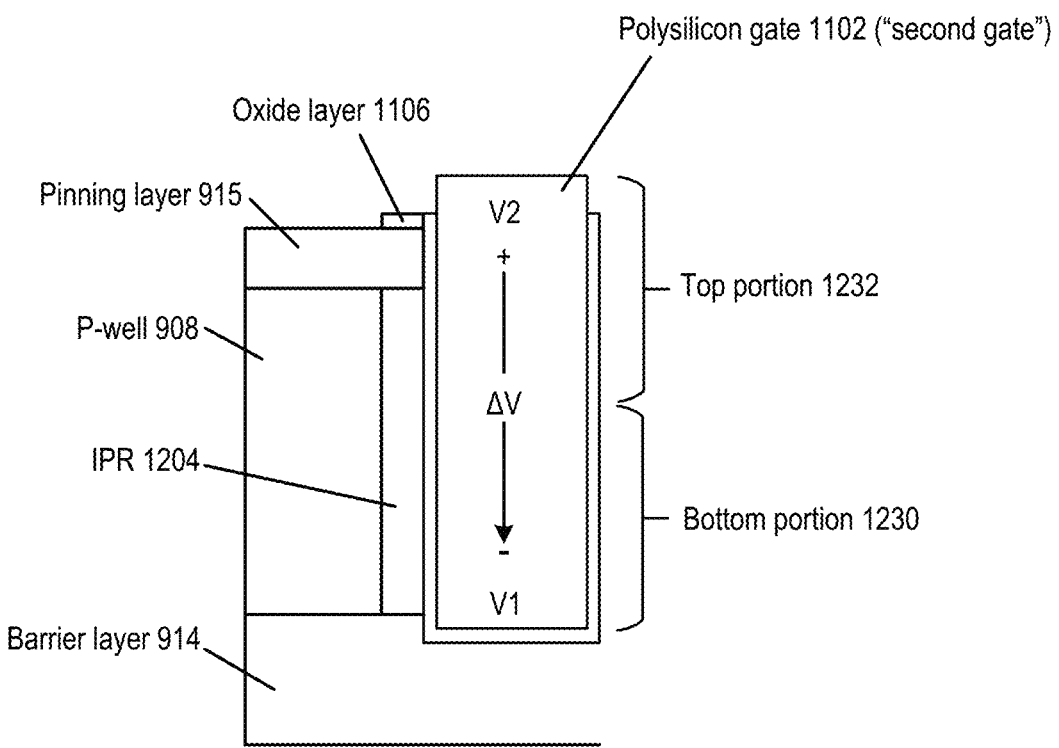

In addition, second gate 1102 can also have a doping profile configured to create an electrical potential difference between IPR 1204 and barrier layer 914. Specifically, second gate 1102 can be doped with charge carrier impurities (P-type or N-type) to improve conductivity and to reduce response time. Referring to FIG. 12F, the dopant concentration at a bottom portion 1230 of second gate 1102, which is the closest to barrier layer 914, can be made to be lower than the dopant concentration at a top portion 1232 of second gate 1102. The dopant concentration gradient within second gate 1102 can also cause opposite charge to flow between bottom portion 1230 and top portion 1232, and a built-in potential difference $\Delta V$ between the two portions may result. Because of the built-in potential difference, the voltage V1 at bottom portion 1230 of second gate 1102 can be reduced by $\Delta V$ with respect to the voltage V2 of signal 1104 applied at top portion 1232 of second gate 1102. Because of the reduced voltage applied to barrier layer 914 with respect to IPR 1204, fewer positive charge is attracted by second gate 1102 and accumulated in barrier layer 914 than in IPR 1204, which can also lead to barrier layer 914 having a lower electrical potential than IPR 1204.

Referring back to FIG. 12B-FIG. 12D, P-well 908 of pixel cell 800 may include optional deep trench isolation (DTI) structures 1240. The DTI structures can act as insulators to reduce coupling between adjacent pixel cell devices (e.g., pixel cells that are placed adjacent to each other along the x and y axes), and to further improve the isolation of the N-type region within the substrate. Each DTI structure may include one or more sidewalls made of Silicon Oxide and filled with a filling material. In some examples, the filling material may include a metal or doped polysilicon and can be conductive such that conductive DTI structures are formed to support active quenching, in which DTI structures 1240 can conduct a voltage to accumulate charge to fill the crystalline defects between P-well 908 and the Silicon Dioxide sidewalls to suppress the dark current caused by the crystalline defects. In FIG. 12B-FIG. 12D, DTI structures 1240 can be back-side DTI structures formed from back side surface 904, but it is understood that DTI structures 1240 can also be formed from front side surface 902. In some examples, DTI structures 1240 can also intersect across pixel cell 800 along the z-axis from front side surface 902 to back side surface 904 to form full-depth DTI structures.

Figures 13A, 13B:
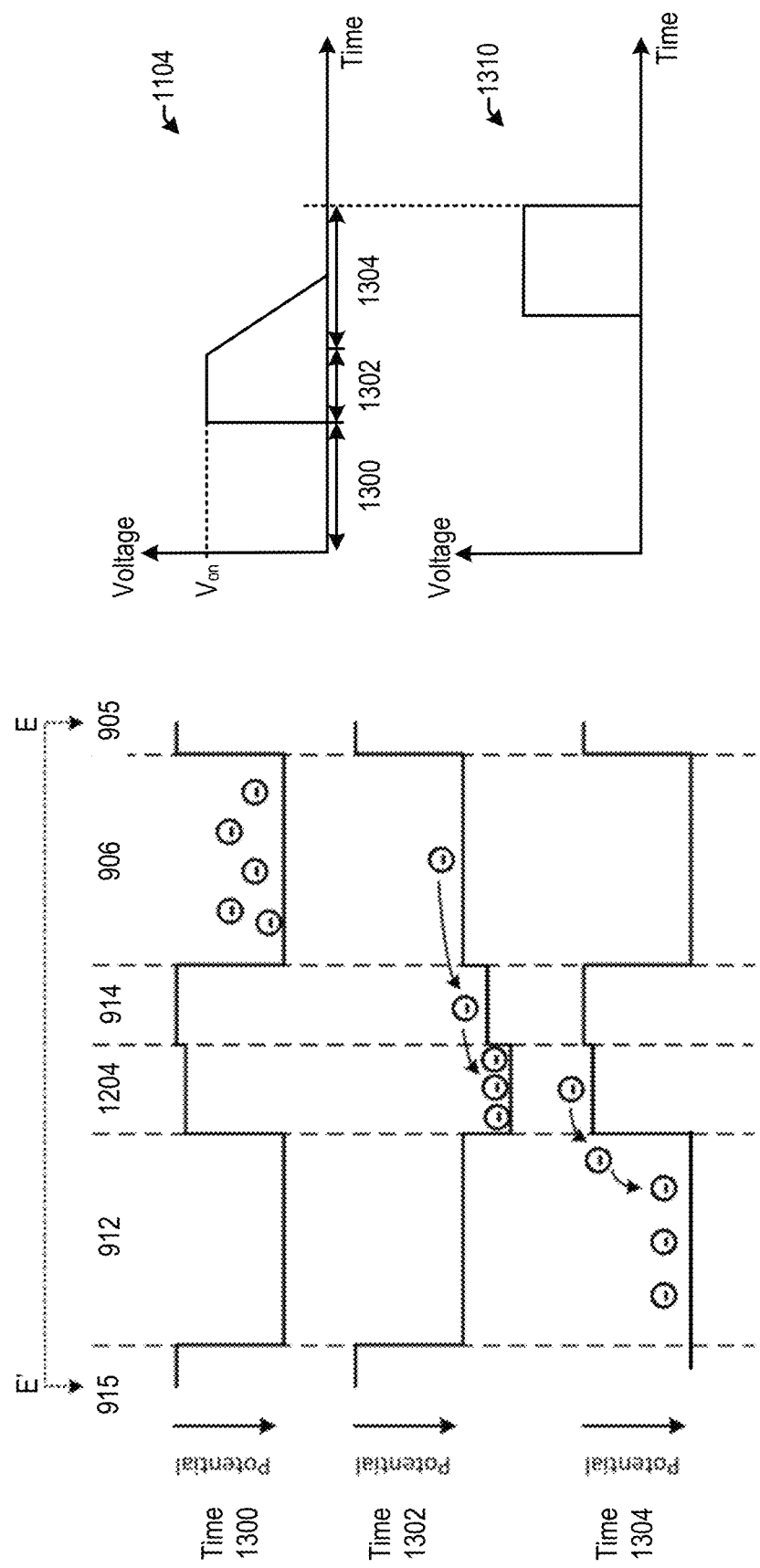
FIG. 13A and FIG. 13B illustrate examples of operations of pixel cell of FIG. 8.

FIG. 13A and FIG. 13B illustrate example operations of pixel cell 800 to perform read out of charge from second photodiode 810. FIG. 13A illustrates changes in the electrical potentials along the conductive path of charge from N-type region 906 of second photodiode 810 to pinning layer 915 with respect to time, whereas FIG. 13B illustrates the corresponding control signals at first gate 918 and second gate 1102.

Referring to both FIG. 13A and FIG. 13B, at time 1300, N-type region 912 of first photodiode 808 can be empty of charge after the stored charge is transferred to floating drain 818, whereas N-type region 912 of second photodiode 810 store negative charge. Second gate 1102 can be biased by signal 1104 at zero or negative voltage. As a result, both barrier layer 914 and IPR 1204 have low electrical potential and can block the negative charge from flowing from N-type region 906 into N-type region 912.

At time 1302, second gate 1102 can be biased by signal 1104 at a positive voltage $V_{on}$. Negative charge in barrier layer 914 and IPR 1204 can be drawn by the positive voltage while the positive charge remains, which can raise the electrical potentials of barrier layer 914 and IPR 1204 above the electrical potential of N-type region 906. Negative charge can then flow from N-type region 906 to barrier layer 914 and then to IPR 1204 following an electrical potential gradient from N-type region 906 to IPR 1204.

At time 1304, second gate 1102 can be biased by signal 1104 back to the zero or negative voltage, which causes the electrical potentials of IPR 1204 and barrier layer 914 to decrease. Negative charge stored in IPR 1204 can flow to N-type region 912 of second photodiode 810 following an electrical potential gradient from IPR 1204 to N-type region 912. At time 1304, a signal 1310 can bias first gate 918 at a positive voltage, which can increase the electrical potential of pinning layer 915 and create a channel to transfer the charge to floating drain 818. As shown in FIG. 13B, the transition time of the falling edge of signal 1104 within time 1304 can be extended (e.g., using a current-starved inverter) to reduce the electrical potentials of IPR 1204 and barrier layer 914 more slowly, which can reduce the likelihood of the charge stored in IPR 1204 moving (against the electrical potential gradient) back to barrier layer 914 and then back to N-type region 906.

FIG. 14A and FIG. 14B illustrate another example operations of pixel cell 800 to perform read out of charge from second photodiode 810. FIG. 14A illustrates changes in the electrical potentials along the conductive path of charge from N-type region 906 of second photodiode 810 to pinning layer 915 with respect to time, whereas FIG. 14B illustrates the corresponding control signals at first gate 918 and second gate 1102.

Referring to FIG. 14A, at time 1400, N-type region 912 of first photodiode 808 can be empty of charge after the stored charge is transferred to floating drain 818, whereas N-type region 912 of second photodiode 810 store negative charge. Second gate 1102 can be biased by signal 1104 at a zero or a negative voltage. As a result, both barrier layer 914 and IPR 1204 have low electrical potential and can block the negative charge from flowing from N-type region 906 into N-type region 912.

In addition, at time 1400 (and at other times), N-type region 912 (of first photodiode 808) is biased at an electrical potential $E_{912}$ higher than the electrical potential $E_{906}$ of N-type region 906 (of second photodiode 810). Such arrangements allow the negative charge to flow from N-type region 906 to N-type region 912 when second gate 1102 can be biased at a positive voltage $V_{on}$ in the subsequent read out, and does not require the bias of second gate 1102 to return back to the zero or negative voltage state to start the flow as in time 1304 of FIG. 13A. As a result, the time needed for subsequent read out of charge from second photodiode 810 can be reduced.

Specifically, at time 1402, second gate 1102 can be biased by signal 1104 at a positive voltage $V_{on}$. Negative charge in barrier layer 914 and IPR 1204 can be drawn by the positive voltage while the positive charge remains, which can raise the electrical potentials of barrier layer 914 and IPR 1204 above the electrical potential of N-type region 906. Meanwhile, the electrical potential of N-type region 912 ($E_{912}$) can remain higher than the electrical potentials of barrier layer 914 and IPR 1204. As a result, an electrical potential gradient can be formed from N-type region 906 to N-type region 912 via barrier layer 914 and IPR 1204, and negative charge can flow following the electrical potential gradient from N-type region 906 to N-type region 912. Negative charge can then flow from N-type region 906 to barrier layer 914 and then to IPR 1204 following an electrical potential gradient from N-type region 906 to IPR 1204 within time 1402. Unlike the arrangements in FIG. 13A, the bias of second gate 1102 to return back to the zero or negative voltage state to create the electrical potential gradient from IPR 1204 to N-type region 912 to start the flow of the negative charge. With such arrangements, signal 1310 can also be configured to bias first gate 918 at a positive voltage at time 1402 to transfer the charge from N-type region 912 to floating drain 818. Moreover, as the second charge move directly from N-type region 906 to N-type region 912 rather than being stored at IPR 1204 and then transferred to N-type region 912, there is little risk of the charge flowing from IPR 1204 back to N-type region 906 when the bias of second gate 1102 moving back to the zero or negative voltage. Therefore the transition time of the falling edge of signal 1104 needs not be extended unlike the example of FIG. 13A and FIG. 13B. All these can reduce the read out time for the charge stored in second photodiode 810 and allows the read out to be performed at a higher frequency, which can further improve the operational speed of pixel cell 800.

In the example of FIG. 14A, $E_{912}$ can be configured such that when N-type region 912 is full of charge (after the charge in N-type region 906 is emptied), the potential at N-type region 912 (which is reduced from $E_{912}$) remains higher than at N-type region 906 (as well as IPR 1204 and barrier layer 914 when turned on) to prevent the charge from flowing back to N-type region 906 at time 1402. A voltage headroom between $E_{912}$ and $E_{906}$ needs to be allocated to ensure a sufficiently high $E_{912}$. The same voltage headroom also needs to be allocated between $E_{912}$ and floating drain 818 to ensure charge can flow from $E_{912}$ to floating drain 818. However, the maximum achievable voltage headroom can be limited by the supply voltage.

Figure 15:
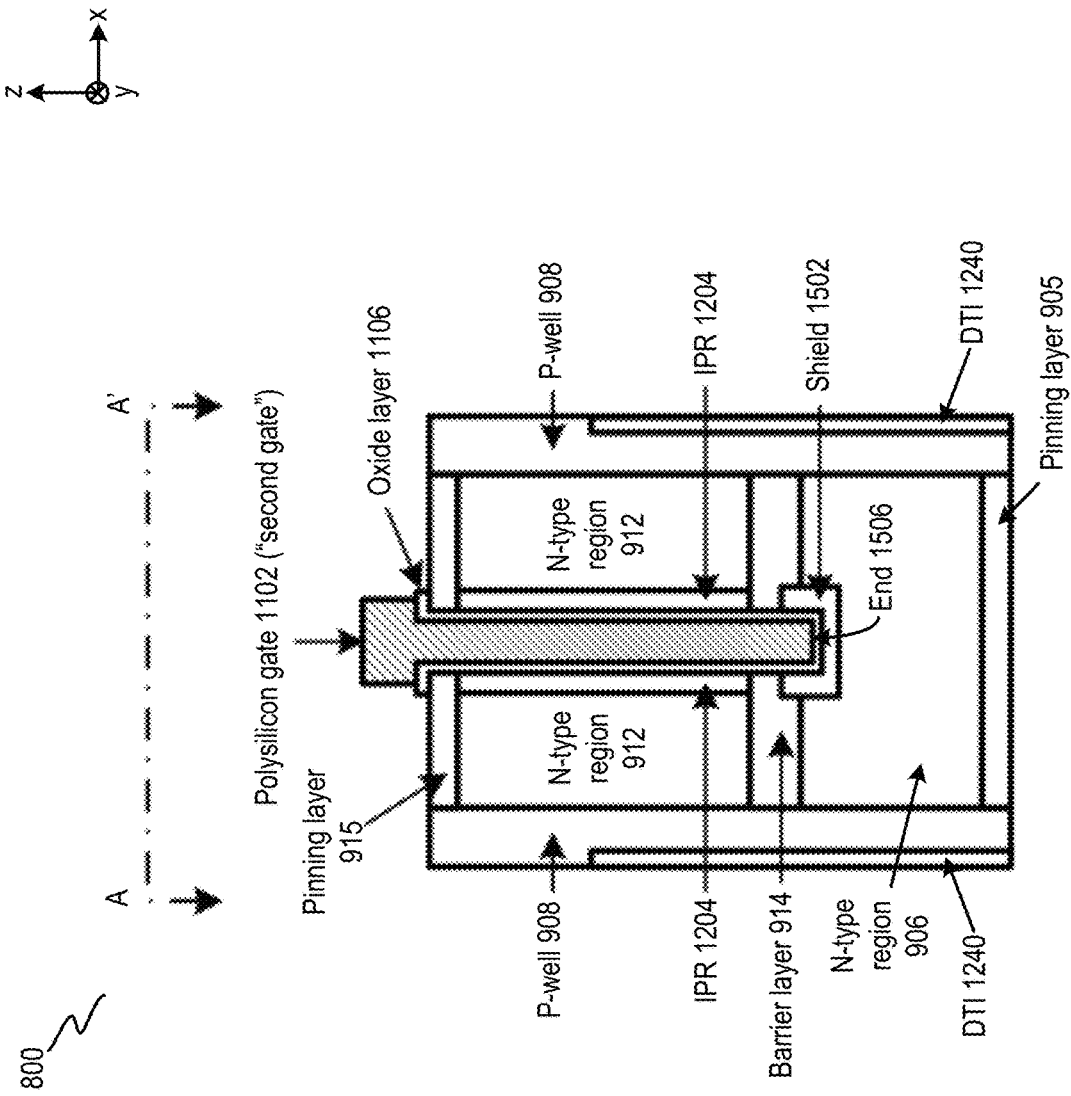
FIG. 15 illustrates examples of internal components of pixel cell of FIG. 8.

FIG. 15 illustrates additional features that can be part of pixel cell 800. As shown in FIG. 15, pixel cell 800 may include a shield 1502 to shield N-type region 906 from second gate 1102, in a case where second gate 1102 penetrates through barrier layer 914 and reaches N-type region 906 due to fabrication uncertainties (e.g., uncertainties in the thickness of barrier layer 914, uncertainties in the implantation depth of barrier layer 914, etc. In FIG. 15, without shield 1502, a positive voltage at end 1506 of second gate 1102 can trap the negative charge in N-type region 906 and prevent the negative charge from flowing through barrier layer 914 during the read out.

To mitigate the effect of second gate 1102 reaching N-type region 906, shield 1502 can be provided to shield the negative charge in N-type region 906 from end 1506 of second gate 1102. In some examples, shield 1502 can be configured as a P-type guard ring that can cover the lateral sides (e.g., sides parallel with the z-axis) and horizontal side (parallel with the x/y axes) of end 1506. The P-type guard ring can provide negative charge to be trapped by the positive voltage at end 1506 and allow the negative charge in N-type region 906 to flow through barrier layer 914 and IPR 1204 under the positive voltage of second gate 1102. In some examples, the P-type guard ring of shield 1502 can be formed by ion implantation after the hole for second gate 1102 is etched to reach end 1506, and after the formation of oxide layer 1106, but before the filling of the hole with the polysilicon material to form second gate 1102. A relative low implantation energy can be used to facilitate correct positioning of shield 1502 with respect to end 1506.

In FIG. 12A-FIG. 15, examples of second gate 1102 having a square cross-sectional shape and an uniform cross-sectional area (e.g., in the shape of a rectangular rod) are shown. However, it is understood second gate 1102 can have other cross-sectional shapes and have non-uniform cross-sectional areas. For example, second gate 1102 can have a circular shape, an octagon shape, etc., if the fabrication process permits. Moreover, second gate 1102 can also have non-uniform cross-sectional areas to further enhance the performance of pixel cell 800.

Figure 16:
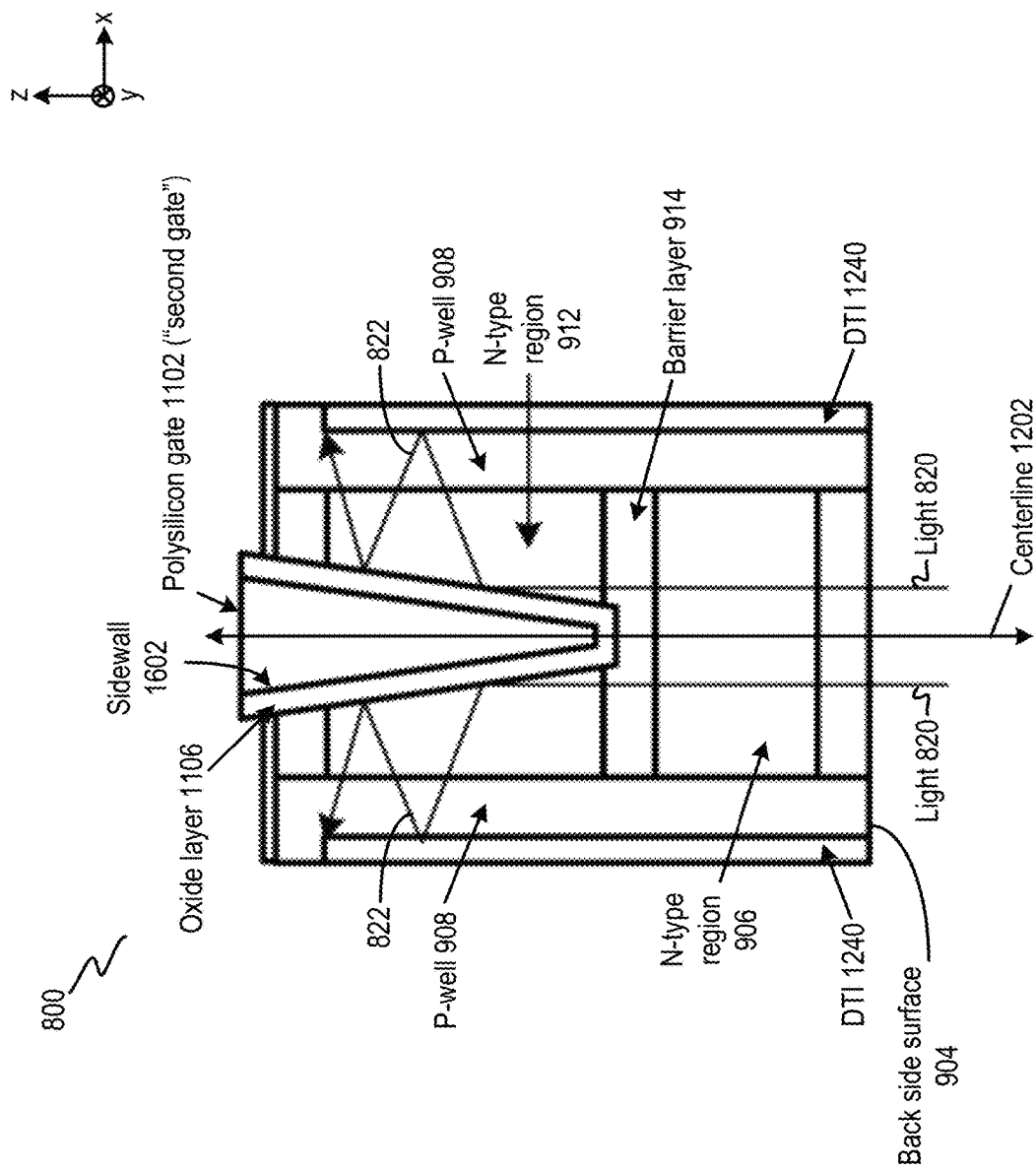
FIG. 16 illustrates examples of internal components of pixel cell of FIG. 8.

FIG. 16 illustrates an example of second gate 1102 having a wedge shape to enhance absorption of first light component 822 (or second light component 824) in N-type region 912 of first photodiode 808. As shown in FIG. 16, second gate 1102 can have a wedge shape having a sidewall 1602 (on which oxide layer 1106 is formed) that forms an angle with centerline 1202 and tilts towards DTI 1240 as well as back side surface 904 which is configured as a light receiving surface. Both the oxide layer 1106 and the DTI 1240 oxide sidewalls can have different refractive indices from P-well 908 and N-type region 912. Sidewall 1602 can reflect first light component 822 of incident light 820 towards DTI 1240 and via N-type region 912 at a pre-determined angle. Total internal reflection of first light component 822 can occur at the interface between P-well 908 and DTI 1240 based on the angle and the different refractive indices. From the interface, first light component 822 can be reflected back towards sidewall 1602 of second gate 1102 and via N-type region 912 again. As first light component 822 undergoes repeated reflection between sidewall 1602 and DTI 1240, first light component 822 travels through a longer distance within N-type region 912, which allows N-type region 912 to convert more photons of first light component 822 to charge. With such arrangements, the rate of photon-to-charge conversion of N-type region 912 for first light component 822 can be improved, which can enhance the intensity measurement of first light component 822.

Figures 17A, 17B:
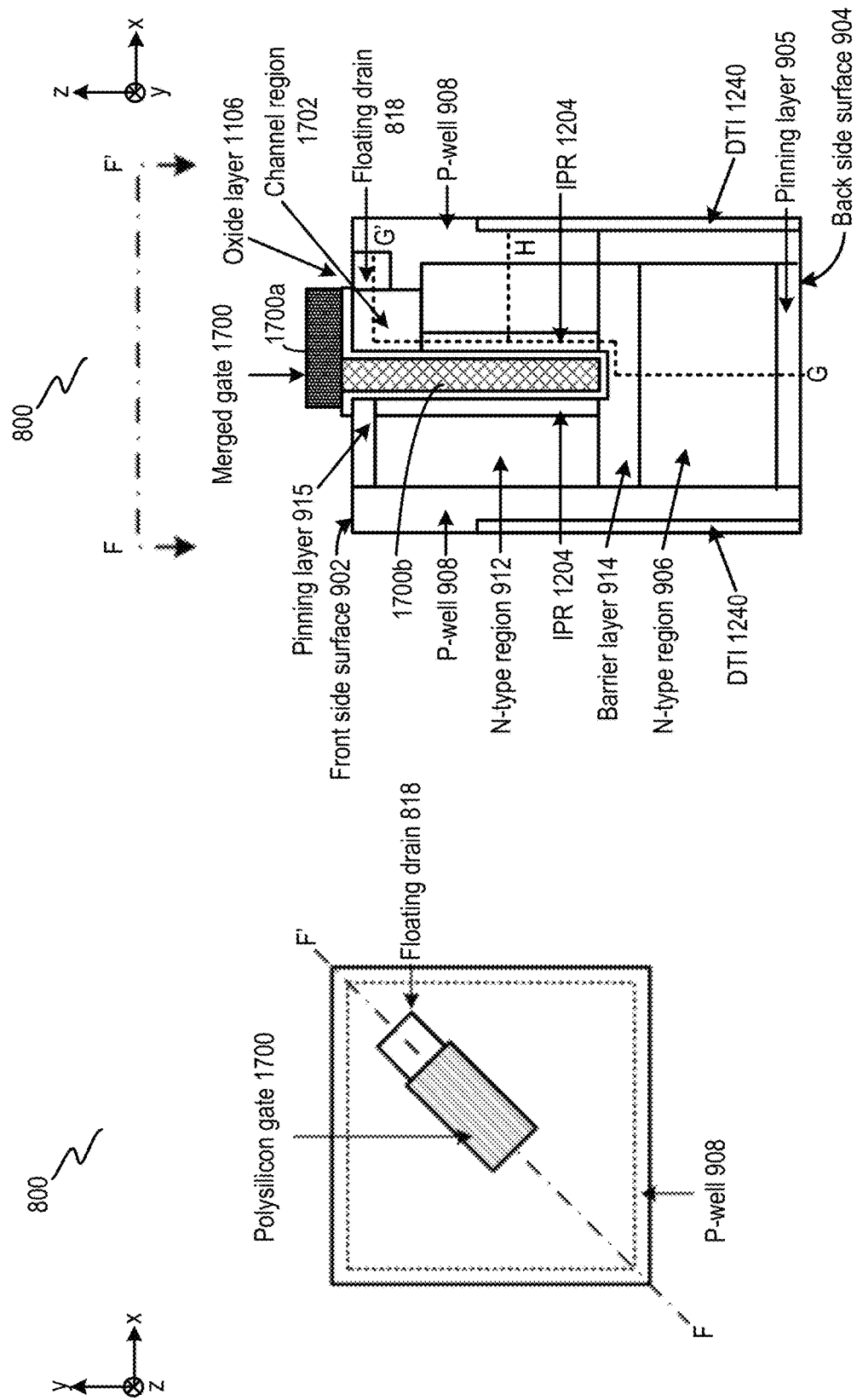
FIG. 17A, FIG. 17B, and FIG. 17C illustrate examples of internal components of pixel cell of FIG. 8 and control signals.

In some examples, first gate 918 and second gate 1102 of pixel cell 800 can be merged to form a single gate. Such arrangements can avoid the clearance distance (e.g., along the x and y axes) between first gate 918 and second gate 1102 and simplify the structure of pixel cell 800, both of which allow the pitch and footprint of pixel cell 800 to be further reduced. FIG. 17A-FIG. 17B illustrate an example of pixel cell 800 having a polysilicon merged gate 1700 which provide the functionalities of both of first gate 918 and second gate 1102. FIG. 17A illustrates a top view (e.g., viewing from the z-axis) of pixel cell 800 having a back side illumination configuration, whereas FIG. 17B illustrates a cross-sectional view of pixel cell 800 along an imaginary cutline F-F' that intersects polysilicon merged gate 1700 and floating drain 818. As shown in FIG. 17B, polysilicon merged gate 1700 can include two portions electrically shorted together. Portion 1700a can be formed on front side surface 902 and over a lightly-doped (e.g., with P-type dopants) channel region 1702, whereas portion 1700b can intersect through at least N-type region 912 of first photodiode 808 and reach barrier layer 914. Portion 1700a can receive one of signal 1104 or signal 1310, and transmit the signal to portion 1700b. If portion 1700a transmits signal 1104, portion 1700b can perform the function of second gate 1102 by transmitting signal 1104 to increase the electrical potential of barrier layer 914 and IPR 1204 to transfer charge from N-type region 906 to N-type region 912. If portion 1700a receives signal 1310, portion 1700a can modulate the electrical potential of channel region 1702 to form a channel to transfer negative charge from N-type region 912 to floating drain 818.

To distinguish between signal 1104 (for transfer of charge via barrier layer 914 and IPR 1204) and signal 1310 (for formation of a channel in channel region 1702 to floating drain 818), the bias voltages and/or doping profile of channel region 1702, barrier layer 914, IPR 1204, the N-type regions of the photodiodes, etc. can be configured such that the formation of a channel in channel region 1702 requires a different input signal level at polysilicon merged gate 1700 than the transfer of charge via barrier layer 914. Specifically, referring back to FIG. 12E, IPR 1204 and barrier layer 914 may have an electrical potential of, respectively, PIPR and PBA with respect to N-type region 906. Both PIPR and PBA can be configured based on the bias voltages and doping profiles of barrier layer 914, IPR 1204, and N-type region 906. To allow negative charge to flow from N-type region 906 into barrier layer 914 and then IPR 1204, signal 1104 needs to have at least the same signal level as PBA to pull the electrical potential of barrier layer 914 up by PBA to become higher than the electrical potential of N-type region 906. Meanwhile, the bias voltage and doping profile of channel region 1702 can determine the threshold voltage for forming a channel in channel region 1702, and the threshold voltage can set the signal level of signal 1310 needed to form the channel.

Figure 17C:
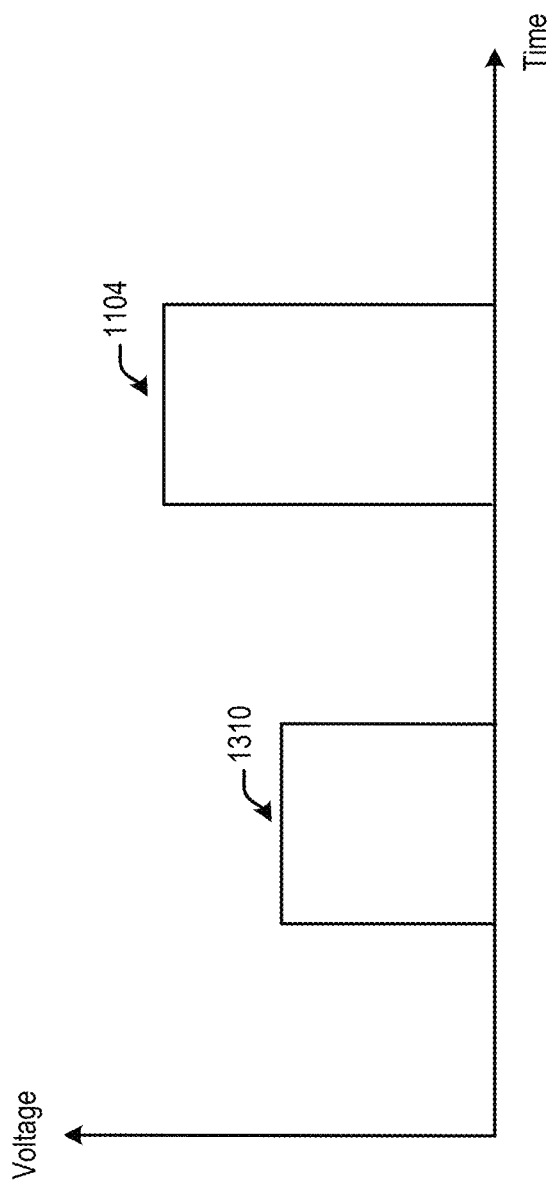

In some examples, as shown in FIG. 17C, signal 1310 can be configured to have a smaller signal level (e.g., a smaller voltage) than signal 1104 such that signal 1310 is high enough to form a channel in channel region 1702 for transfer of charge generated at N-type region 912 of first photodiode 808, but not high enough (e.g., less than PBA) to pull the electrical potential of barrier layer 914 above the electrical potential of N-type region 906 for transfer of charge via barrier layer 914. Meanwhile, signal 1104 is high enough (e.g., higher than or equal to PBA) to allow both transfer of charge via barrier layer 914 to N-type region 912, as well as formation of a channel in channel region 1702 to transfer the charge received from N-type region 912 to floating drain 818. Unlike the prior two-step read-out schemes where charge from N-type region 906 needs to be stored in the N-type region 912 first before readout, the single gate arrangement allows faster read out of charge from N-type region 912.

Figure 18:
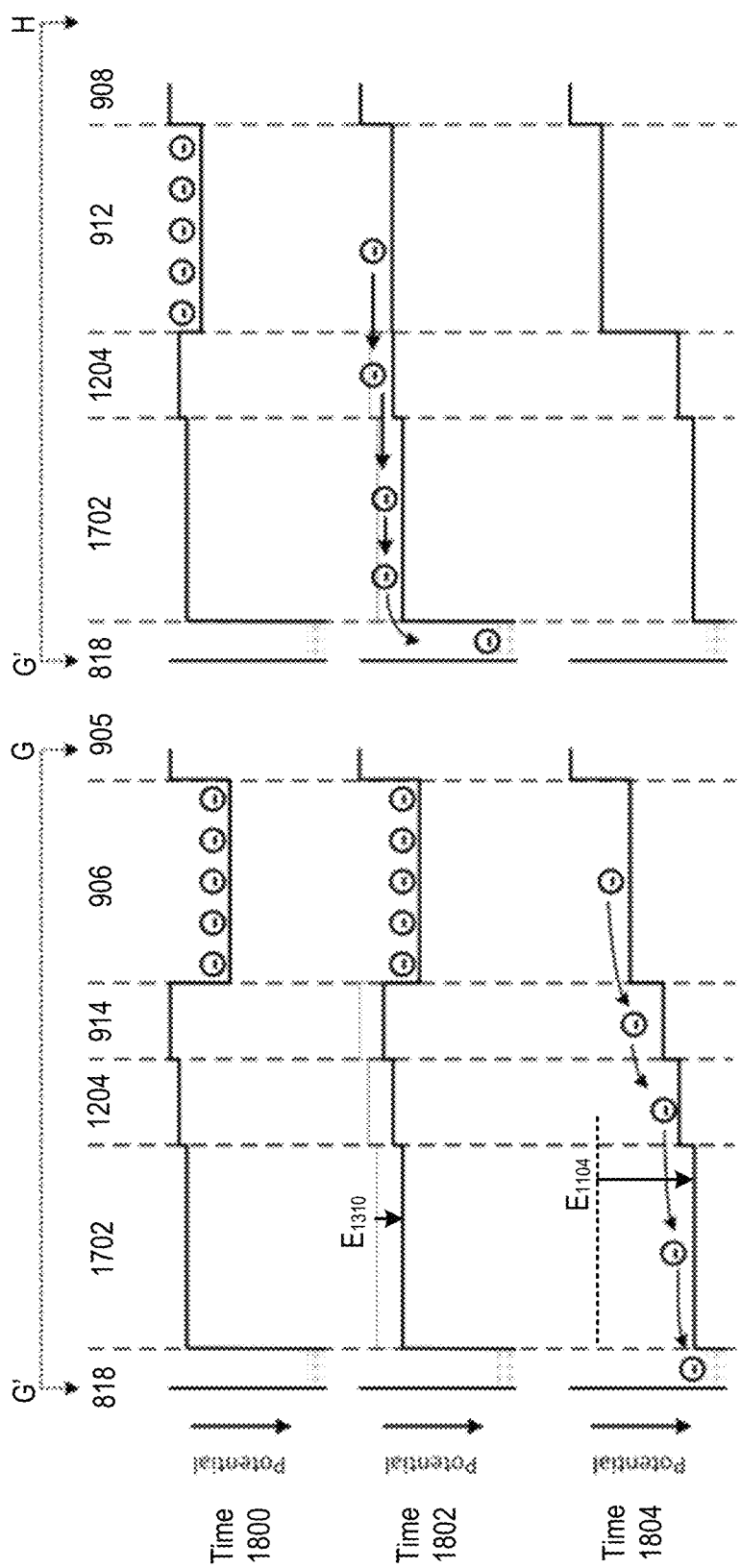
FIG. 18 illustrates examples of operations of pixel cell of FIG. 8.

FIG. 18 illustrates example operations of pixel cell 800 of FIG. 17A and FIG. 17B. FIG. 18 illustrates changes in the electrical potentials along a cut line G-G' from N-type region 906 (of second photodiode 810) to floating drain 818, as well as changes in the electrical potentials along a cut line H-G' from N-type region 912 (of first photodiode 808) to floating drain 818.

At time 1800, polysilicon merged gate 1700 may receive a signal of a zero or negative voltage. Along cut line G-G', IPR 1204 and barrier layer 914 have electrical potentials lower than that of N-type region 906 and can prevent the negative charge in N-type region 906 from flowing to N-type region 912. Moreover, along cut line H-G', both P-well 908 and IPR 1204 have electrical potentials lower than that of N-type region 912, and negative charge generated by N-type region 912 (from conversion of first light component 822) can be stored in N-type region 912 as a result.

At time 1802, polysilicon merged gate 1700 may receive signal 1310 as shown in FIG. 17C. the signal level of signal 1310 is high enough to pull up the electrical potentials of IPR 1204 and channel region 1702 to form a channel to floating drain 818. Negative charge stored in N-type region 912 can flow via IPR 1204 and channel region 1702 to floating drain 818 for read out. Meanwhile, the electrical potentials of IPR 1204, barrier layer 914, and channel region 1702 can be pulled up by signal 1310 by an electrical potential difference $E_{1310}$, but at least the electrical potential of barrier layer 914 remains below that of N-type region 906. The negative charge remains trapped by barrier layer 914 in N-type region 906 as a result.

At time 1804, polysilicon merged gate 1700 may receive signal 1104 as shown in FIG. 17C. Signal 1104 may have a higher signal level than signal 1310. Along cut line G-G', the electrical potentials of IPR 1204, barrier layer 914, and channel region 702 can be pulled up by signal 1310 by an electrical potential difference $E_{1104}$, and those electrical potentials are now above the electrical potential of N-type region 906. An electrical potential gradient can be formed from N-type region 906 to floating drain 818. A channel is also formed in channel region 702. The negative charge can then flow from N-type region 906 to floating drain following the electrical potential gradient.

Figure 19:
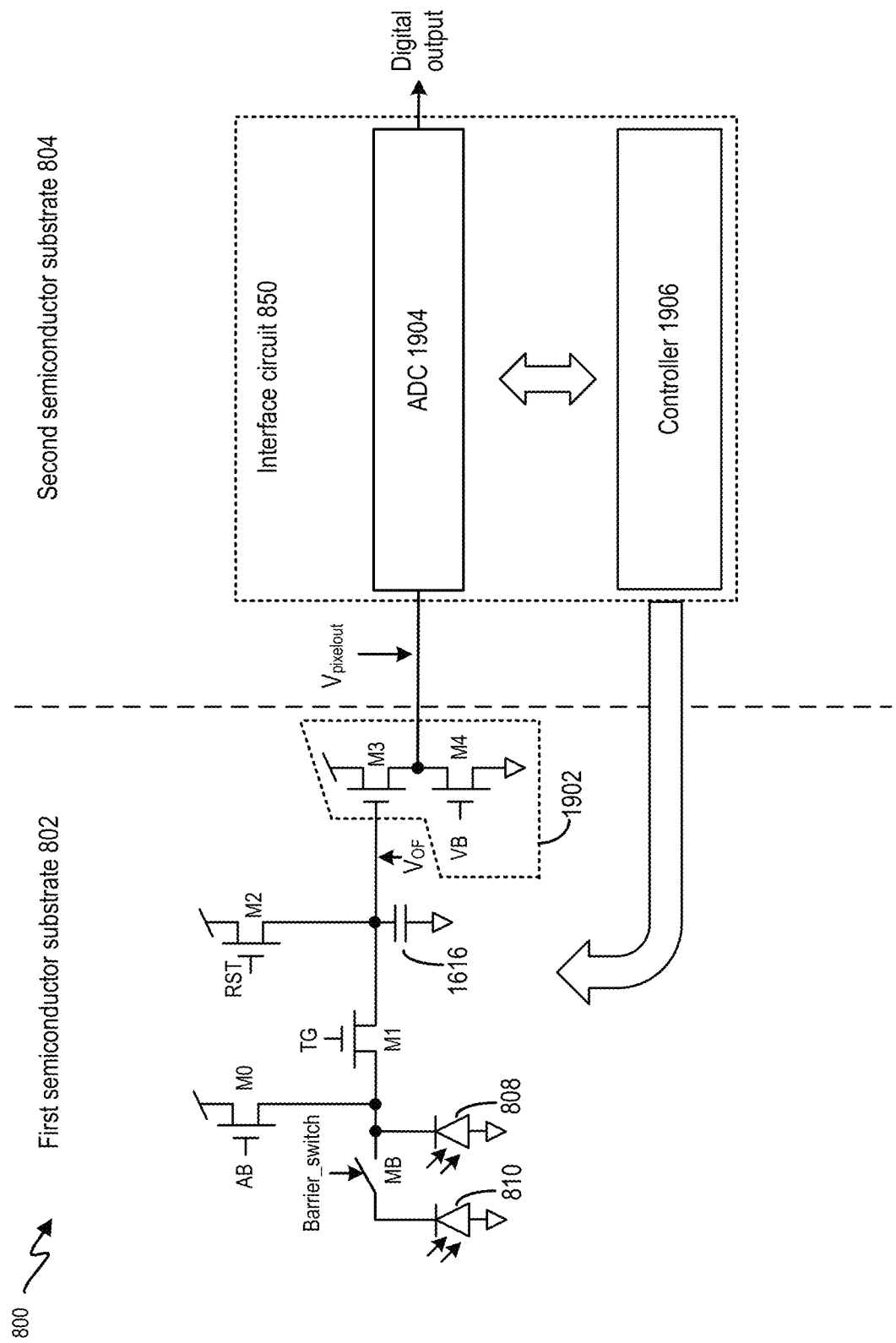
FIG. 19 illustrates examples of internal components of pixel cell of FIG. 8.

FIG. 19 illustrates an example schematic representation of various circuits of pixel cell 800. As shown in FIG. 19, pixel cell 800 includes a set of switches M0, M1, M2, first photodiode 808, second photodiode 810, charge storage device 616, a voltage buffer 1902, an analog-to-digital converter (ADC) 1904, and a controller 1906. First photodiode 808, second photodiode 810, charge storage device 616, as well as voltage buffer 1902 can be implemented in first semiconductor substrate 802, whereas ADC 1904 and controller 1906 can be implemented in second semiconductor substrate 804. First photodiode 808 and second photodiode 810 can be configured to primarily convert different components of incident light 820 to charge. The charge can be read out and stored in charge storage device 616 to develop a voltage (labelled "VoF"), which can be buffered by voltage buffer 1902 to become a pixel output voltage (labelled "$V_{pixelout}$"). The pixel output voltage can be quantized by ADC 1904 to generate a digital output. Controller 1906 can control the switches as well as ADC 1904 to perform the read out and quantization processes.

First photodiode 808 and second photodiode 810 can be configured to primarily convert different components of incident light 820 to charge based on a configuration of pixel cell 800. For example, in a case where pixel cell 800 is a back-side illuminated (FSI) device where second photodiode 810 is closer to light receiving surface 806 than first photodiode 808, first photodiode 808 can be configured to detect infra-red light as first light component 822, whereas second photodiode 810 can be configured to detect visible light (e.g., one of red, green, or blue colors) as second light component 824. In a case where pixel cell 800 is a front-side illuminated (BSI) device where first photodiode 808 is closer to light receiving surface 806 than second photodiode 810, first photodiode 808 can be configured to detect visible light (e.g., one of red, green, or blue colors) as first light component 822, whereas second photodiode 810 can be configured to detect visible light (e.g., one of red, green, or blue colors) as second light component 824. Each of first photodiode 808 and second photodiode 810 has a quantum well to store charge generated in response to, respectively, first light component 822 and second light component 824.

In addition, charge storage device 616 can provide storage for read out of charge stored in first photodiode 808 and second photodiode 810. Before a new measurement, charge storage device 616 can be reset by the M2 reset switch, which can be enabled by the RST signal to connect charge storage device 616 to a charge sink to remove the charge stored in charge storage device 616. The charge can then be read out from first photodiode 808 or second photodiode 810 via transfer switch M1 and stored in charge storage device 616 for a subsequent quantization processing. Charge storage device 616 can develop the VoF voltage based on the quantity of stored charge, which can be buffered by voltage buffer 1902 to become the pixel output voltage $V_{pixelout}$. The pixel output voltage $V_{pixelout}$ can be quantized by ADC 1904 to generate a digital output.

The switches M0, M1, and MB can control the generation and transfer of charge from first photodiode 808 and second photodiode 810 to charge storage device 616 for read out and quantization operations. Barrier switch MB can control the flow of charge from second photodiode 810 to first photodiode 808 for read out. Barrier switch MB can represent barrier layer 914 and can be controlled by the barrier switch signal, which can be signal 1104. The barrier_switch signal can represent an electrical potential difference between barrier layer 914 and first semiconductor substrate 802 and can be configured based on, for example, applying signal 1104 via second gate 1102 or merged gate 1700.

In addition, switch M0 can be a shutter switch. Shutter switch M0, controlled by the AB signal, can control the start and end of an exposure period in which first photodiode 808 is allowed to accumulate the charge generated in response to incident light 820. The disabling of shutter switch M0 can start the exposure period for both first photodiode 808 and second photodiode 810, whereas the enabling of shutter switch M0 can reset first photodiode 808 and end the exposure period. Second photodiode 810 can also be reset if barrier switch MB is also enabled. Shutter switch M0 can also be configured to provide an anti-blooming function to prevent charge generated by first photodiode 808 (and/or second photodiode 810) from leaking into other pixel cells of the image sensor, especially when the image sensor operates in an environment with strong ambient light.

Further, transfer switch M1 can be controlled by the TG signal, which can correspond to signal 1310, to set the electrical potential of channel region 922, which can control the flow of charge to charge storage device 616. Transfer switch M1 can be represented by, for example, first gate 918, merged gate 1700, etc. For example, the TG signal to configure transfer switch M1 in a partially-on state to allow charge accumulated at first photodiode 808 as residual charge until the quantity of stored charge at first photodiode 808 exceeds a threshold. Transfer switch M1 allows additional charge generated by first photodiode 808 to flow to charge storage device 616 as overflow charge. Moreover, TG signal can also configure transfer switch M1 in a fully-on state to transfer residual charge stored in first photodiode 808 to charge storage device 616 for read out and quantization.

Transfer switch M1 and barrier switch MB can control the read out and quantization of charge from first photodiode 808 and second photodiode 810. In a first read out, barrier switch MB can be disabled. Transfer switch M1 can be configured in the fully-on state to transfer charge from first photodiode 808 ("first charge") to charge storage device 616. The transferred first charge can be stored in charge storage device 616 and quantized by ADC 1904 to generate a first digital output. Both first photodiode 808 and charge storage device 616 can then be reset after the quantization completes. A second read out can follow, in which barrier switch MB can be enabled. Charge stored in photodiode 810 ("second charge") can then be transferred to photodiode 808 via barrier switch MB. Transfer switch M1 can also be configured in the fully-on state to transfer the second charge from photodiode 808 to charge storage device 616 for subsequent quantization by ADC 1904 to generate a second digital output. Controller 1906 generate the control signals for transfer switch M1 and barrier switch MB (e.g., signals 1310 and 1104) to perform the read out of the first charge and the second charge based on the sequences described in, for example, FIG. 13A, FIG. 13B, and FIG. 18.

FIG. 20 illustrates a flowchart of an example method 2000 for measuring light intensity. Method 2000 can be performed by controller 1906 and photodiodes 808 and 810. Photodiodes 808 and 810 can be part of pixel cell 800 of FIG. 8-FIG. 17B.

Method 2000 starts with step 2002, in which controller 1906 transmits, via a first gate portion of one or more gates, a first signal to transfer first charge from a first photodiode to a floating drain via a channel region between the first photodiode and the floating drain for read out. In some examples, the first gate portion can be polysilicon gate 918 formed on front side surface 902 of semiconductor substrate 802. In some examples, the first gate portion can be portion 1700a of merged gate 1700.

As discussed above, the semiconductor substrate further includes the floating drain (e.g., floating drain 818), the first photodiode (e.g., formed by N-type region 912) to generate the first charge, a second photodiode (formed by N-type region 906) to generate a second charge, and a barrier layer (e.g., barrier layer 914) between the first photodiode and the second photodiode. The first photodiode, the barrier layer, and the second photodiode form a stack along an axis perpendicular to the front side surface. The first signal can cause a channel to be formed in a channel region under the first gate portion to transfer the first charge out of the first photodiode. In some examples, the first photodiode is further away from the light receiving surface than the second photodiode and is configured to convert photons of infra-red light to the first charge. In some examples, the first photodiode is closer to the light receiving surface than the second photodiode and is configured to convert photons of visible light to the first charge.

In step 2004, the first charge can be read out from the floating drain and quantized to measure an intensity of light of a first wavelength range (e.g., infra-red or visible light). The quantization can be performed by ADC 1904.

In step 2006, controller 1906 transmits, via a second gate portion of the one or more gates, a second signal to transfer the second charge from the second photodiode to the first photodiode via the barrier layer, wherein the second gate portion extends from the front side surface through the first photodiode and reaches the barrier layer. In some examples, the second gate portion can be polysilicon gate 1102. In some examples, the second gate portion can be portion 1700b of merged gate 1700. The second signal can change the electric potential of the barrier layer as well as the IPR (e.g., IPR 1204) to allow the second charge to move from the second photodiode to the first photodiode, based on the techniques described above. Depending on the location of the second photodiode with respect to the light receiving surface, the second charge can be generated from the photons of visible light or infra-red light.

In step 2008, controller 1906 transmits the first signal via the first gate portion to transfer the second charge from the first photodiode to the floating drain via the channel region.

In step 2010, ADC 1904 can read out and quantize the second charge from the floating drain to measure an intensity of light of a second wavelength range (e.g., visible light or infra-red light).

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
a semiconductor substrate including:
a front side surface;
a first photodiode configured to generate a first charge;
a second photodiode configured to generate a second charge;
a barrier layer between the first photodiode and the second photodiode and configured to control flow of the second charge from the second photodiode to the first photodiode, wherein the first photodiode, the barrier layer, and the second photodiode form a stack along an axis perpendicular to the front side surface; and
a floating drain to store the first charge or the second charge; one or more gates including:
a first gate portion on the front side surface over a channel region between the first photodiode and the floating drain; and
a second gate portion extending from the front side surface through the first photodiode and having an end portion that terminates at or above the barrier layer along the axis,
wherein the first gate portion is configured to conduct a first signal to control a flow of the first charge from the first photodiode to the floating drain via the channel region, and
wherein the second gate portion is configured to conduct a second signal to control the barrier layer to control a flow of the second charge.

2. The apparatus of claim 1, further comprising a controller configured to:
transmit the first signal via the first gate portion to transfer the first charge from the first photodiode to the floating drain via the channel region for read out;
transmit the second signal via the second gate portion to transfer the second charge from the second photodiode to the first photodiode via the barrier layer; and
transmit the first signal via the first gate portion to transfer the second charge from the second photodiode to the floating drain via the channel region for read out.

3. The apparatus of claim 2, wherein the semiconductor substrate is a first semiconductor substrate; and
wherein the apparatus further includes a second semiconductor substrate; and
wherein the controller is part of the second semiconductor substrate.

4. The apparatus of claim 1, wherein:
the semiconductor substrate includes a back side surface opposite to the front side surface configured as a light receiving surface;
the first photodiode is configured to convert a first component of light within an infra-red light wavelength range to the first charge; and
the second photodiode is configured to convert a second component of light within a visible light wavelength range to the second charge.

5. The apparatus of claim 1, wherein:
the front side surface is configured as a light receiving surface;
the first photodiode is configured to convert a first component of light within a visible light wavelength range to the first charge; and
the second photodiode is configured to convert a second component of light within an infra-red light wavelength range to the second charge.

6. The apparatus of claim 1, wherein the semiconductor substrate includes a P-well forming a sidewall on four sides of the stack of the first photodiode, the barrier layer, and the second photodiode; and wherein the second gate portion extends along a center line through the first photodiode, the center line being of equal distance from at least two of the sidewalls formed by the P-well.

7. The apparatus of claim 1, further comprising:
an oxide layer between the second gate portion and the first photodiode; and
an interface passivation region (IPR) between the oxide layer and the first photodiode.

8. The apparatus of claim 7, wherein the IPR and the barrier layer are configured to have provide an electrical potential gradient from the second photodiode to the first photodiode.

9. The apparatus of claim 8, wherein the IPR and the barrier layer have different doping profiles to provide the electrical potential gradient.

10. The apparatus of claim 8, wherein the second gate portion is doped with dopants having a doping concentration gradient along the axis to introduce the electrical potential gradient.

11. The apparatus of claim 1, wherein:
the second photodiode is biased at a first voltage;
the barrier layer is biased at a second voltage by a signal at the second gate portion;
the first photodiode is biased at a third voltage;
the channel region is biased at a fourth voltage by a signal at the first gate portion; and
the first voltage, the second voltage, the third voltage, and the fourth voltage form an electrical potential gradient from the second photodiode to the channel region to enable the second charge to flow following the electrical potential gradient.

12. The apparatus of claim 1, further comprising a guard ring structure that shields the end portion of the second gate portion from the barrier layer.

13. The apparatus of claim 1, wherein the second gate portion has non-uniform cross-sectional areas.

14. The apparatus of claim 13, wherein the second gate portion has a wedge shape and includes a tilted sidewall that tilts towards a light receiving surface.

15. The apparatus of claim 14, wherein the semiconductor substrate further includes a deep trench isolation (DTI) structure that extend along the axis;
wherein at least a part of the first photodiode is between the DTI structure and the tilted sidewall of the second gate portion;
wherein the tilted sidewall also tilts towards the DTI structure and configured to reflect light towards the DTI structure and through the at least a part of the first photodiode; and
wherein the DTI structure is configured reflect light towards the tilted sidewall and through the at least a part of the first photodiode.

16. The apparatus of claim 1, wherein the one or more gates comprise a first gate comprising the first gate portion and a second gate comprising the second gate portion; and
wherein the first gate and the second gate are electrically insulated from each other.

17. The apparatus of claim 1, wherein the one or more gates comprise a merged gate comprising the first gate portion and the second gate portion electrically connected to each other.

18. The apparatus of claim 17, further comprising a controller configured to:
transmit the first signal via the first gate portion to transfer the first charge from the first photodiode to the floating drain via the channel region for read out;
transmit the second signal via the second gate portion to:
transfer the second charge from the second photodiode to the first photodiode via the barrier layer; and
transfer the second charge from the second photodiode to the floating drain via the channel region for read out,
wherein the first signal is insufficient to cause the second charge to flow from the second photodiode to the first photodiode via the barrier layer.

19. The apparatus of claim 1, further comprising an oxide layer that shields the end portion of the second gate portion from the barrier layer.

20. The apparatus of claim 19, wherein the oxide layer also shields the second gate portion from the first photodiode.

21. The apparatus of claim 19, wherein at least one of: the end portion of the second gate portion, or a portion of the oxide layer that shields the end portion from the barrier layer, protrude into and terminate at the barrier layer.

22. The apparatus of claim 19, wherein both the end portion of the second gate portion and a portion of the oxide layer that shields the end portion from the barrier layer terminate above the barrier layer along the axis.

23. A method comprising:
transmitting, via a first gate portion of one or more gates, a first signal to transfer a first charge from a first photodiode to a floating drain via a channel region between the first photodiode and the floating drain for read out, wherein the first gate portion is formed on a front side surface of a semiconductor substrate, the semiconductor substrate further including the floating drain, the first photodiode to generate the first charge, a second photodiode to generate a second charge, a barrier layer between the first photodiode and the second photodiode, the first photodiode, the barrier layer, and the second photodiode forming a stack along an axis perpendicular to the front side surface;
quantizing the first charge in the floating drain to measure an intensity of light of a first wavelength range;
transmitting a second signal via a second gate portion of the one or more gates to transfer the second charge from the second photodiode to the first photodiode via the barrier layer, wherein the second gate portion extends from the front side surface through the first photodiode and has an end portion that terminates at or above the barrier layer along the axis;
transmitting the first signal via the first gate portion to transfer the second charge from the first photodiode to the floating drain via the channel region; and
quantizing the second charge in the floating drain to measure an intensity of light of a second wavelength range.

24. The method of claim 23, wherein the first wavelength range corresponds to a wavelength range of infra-red light, and wherein the second wavelength range corresponds to a wavelength range of visible light.

* * * * *